(12) United States Patent
Finn

(10) Patent No.: US 9,027,227 B2
(45) Date of Patent: May 12, 2015

(54) TRANSFERRING AN ANTENNA TO AN RFID INLAY SUBSTRATE

(71) Applicant: David Finn, Tourmakeady County Mayo (IE)

(72) Inventor: David Finn, Tourmakeady County Mayo (IE)

(73) Assignee: Féinics Amatech Teoranta, Lower Churchfield, Tourmakeady, Co Mayo (IE)

( * ) Notice: Subject to any disclaimer, the term of this patent is extended or adjusted under 35 U.S.C. 154(b) by 44 days.

(21) Appl. No.: 14/061,864

(22) Filed: Oct. 24, 2013

(65) Prior Publication Data

US 2014/0059841 A1    Mar. 6, 2014

Related U.S. Application Data

(63) Continuation of application No. 13/027,415, filed on Feb. 15, 2011, now Pat. No. 8,613,132, which is a continuation-in-part of application No. 12/877,085, (Continued)

(51) Int. Cl.
| | |
|---|---|
| *H01Q 17/00* | (2006.01) |
| *H01P 11/00* | (2006.01) |
| *G06K 19/077* | (2006.01) |
| *H01Q 1/22* | (2006.01) |
| *H01Q 1/38* | (2006.01) |
| *H01Q 1/40* | (2006.01) |
| *H01Q 7/00* | (2006.01) |

(52) U.S. Cl.
CPC ........ *H01P 11/001* (2013.01); *G06K 19/07722* (2013.01); *G06K 19/07745* (2013.01); *G06K 19/07749* (2013.01); *G06K 19/0775* (2013.01); *H01L 2224/48091* (2013.01); *H01L 2224/78301* (2013.01); *H01Q 1/2225* (2013.01); *H01Q 1/38* (2013.01); *H01Q 1/40* (2013.01); *H01Q 7/00* (2013.01); *H01L 2224/45124* (2013.01); *H01L 2224/45147* (2013.01); *H01L 2224/16227* (2013.01); *H01L 2924/01047* (2013.01); *H01L 2224/16225* (2013.01)

(58) Field of Classification Search
CPC ............. H01L 25/50; G06K 19/07779; G06K 19/07773; H01F 17/0033; H01F 41/0658
USPC ........ 29/601, 33 M, 600, 739, 748, 753, 827, 29/829, 843, 845, 850; 340/539.1, 568.1, 340/572.1, 572.7
See application file for complete search history.

(56) References Cited

U.S. PATENT DOCUMENTS

| | | | |
|---|---|---|---|
| 6,698,089 B2 * | 3/2004 | Finn et al. | 29/748 |
| 7,768,405 B2 * | 8/2010 | Yamazaki et al. | 340/572.7 |
| 2008/0179404 A1 * | 7/2008 | Finn | 235/492 |

*Primary Examiner* — Thiem Phan
(74) *Attorney, Agent, or Firm* — Gerlad E. Linden

(57) ABSTRACT

Forming antenna structures having several conductor turns (wire, foil, conductive material) on a an antenna substrate (carrier layer or film or web), removing the antenna structures individually from the antenna substrate using pick & place gantry or by means of die punching, laser cutting or laminating, and transferring the antenna structure with it's end portions (termination ends) in a fixed position for mounting onto or into selected transponder sites on an inlay substrate, and connecting the aligned termination ends of the antenna structure to an RFID (radio frequency identification) chip or chip module disposed on or in the inlay substrate. A contact transfer process is capable of transferring several antenna structures simultaneously to several transponder sites.

16 Claims, 17 Drawing Sheets

Related U.S. Application Data filed on Sep. 7, 2010, now Pat. No. 8,522,431, said application No. 13/027,415 is a continuation-in-part of application No. 12/901,590, filed on Oct. 11, 2010, now abandoned.

(60) Provisional application No. 61/259,224, filed on Nov. 9, 2009, provisional application No. 61/351,902, filed on Jun. 6, 2010, provisional application No. 61/361,895, filed on Jul. 6, 2010, provisional application No. 61/367,466, filed on Jul. 26, 2010, provisional application No. 61/331,368, filed on May 4, 2010, provisional application No. 61/363,763, filed on Jul. 13, 2010, provisional application No. 61/414,408, filed on Nov. 16, 2010, provisional application No. 61/437,795, filed on Jan. 31, 2011, provisional application No. 61/437,649, filed on Jan. 30, 2011, provisional application No. 61/442,284, filed on Feb. 13, 2011.

Prior Art - Leadframe Type Chip Module

Prior Art - Epoxy Glass Type Chip Module

"portions" of the antenna wire 4 individual turns of antenna wire
being installed in 4 individual channel portions 4 turns of an antenna structure
being installed in a single wide antenna trench Roller Coater Station Cover Placement Station Lamination Station Finishing Station

TRANSFERRING AN ANTENNA TO AN RFID INLAY SUBSTRATE

CROSS-REFERENCE TO RELATED APPLICATION(S)

This is a continuation of U.S. Ser. No. 13/027,415 filed Feb. 15, 2011.

U.S. Ser. No. 13/027,415 is a continuation-in-part of U.S. Ser. No. 12/877,085 filed Sep. 7, 2010, which is
  a nonprovisional of U.S. 61/259,224 filed Nov. 9, 2009
  a nonprovisional of U.S. 61/351,902 filed Jun. 6, 2010
  a nonprovisional of U.S. 61/361,895 filed Jul. 6, 2010
  a nonprovisional of U.S. 61/367,466 filed Jul. 26, 2010
U.S. Ser. No. 13/027,415 is a continuation-in-part of U.S. Ser. No. 12/901,590 filed Oct. 11, 2010
U.S. Ser. No. 13/027,415 is a nonprovisional of U.S. 61/331,368 filed May 4, 2010
U.S. Ser. No. 13/027,415 is a nonprovisional of U.S. 61/363,763 filed Jul. 13, 2010
U.S. Ser. No. 13/027,415 is a nonprovisional of U.S. 61/414,408 filed Nov. 16, 2010
U.S. Ser. No. 13/027,415 is a nonprovisional of U.S. 61/437,795 filed Jan. 31, 2011
U.S. Ser. No. 13/027,415 is a nonprovisional of U.S. 61/437,649 filed Jan. 30, 2011
U.S. Ser. No. 13/027,415 is a nonprovisional of U.S. 61/442,284 filed Feb. 13, 2011

TECHNICAL FIELD

The invention relates to "inlay substrates" used in the production of "inlays" for "security documents" such as electronic passports, electronic ID cards and smart cards and, more particularly, for example, to how an antenna may be mounted to the inlay substrate (and connected to an RFID (radio frequency identification) chip or chip module disposed on the inlay substrate).

BACKGROUND

Transponders are electronic devices incorporated into secure documents such as "smart cards" and "electronic passports" using RFID (radio frequency identification) technology.

The transponder (or inlay, or chip card) itself generally comprises (includes):
  a substrate (or inlay substrate) which may comprise a sheet of a synthetic material or paper;
  a chip (or chip module, chip unit or naked die) installed on the substrate (or in a recess in the surface of the substrate) and having terminals (or contact surfaces, or pads); and
  an antenna wire (or conductor) mounted on or in the substrate, formed with "turns" as a flat (substantially planar) coil and connected (bonded) by its ends or end portions to the terminals (terminal areas) of the chip module.

The inlay substrate may comprise one or more layers of Polyvinyl Chloride (PVC), Polycarbonate (PC), polyethylene (PE), PET (doped PE), PETE (derivative of PE), TYVEK, Teslin™, Paper or Cotton/Noil, and the like. For example, a single layer of uncoated Teslin™, with a thickness of 356 microns. In the main hereinafter, inlay substrates comprising Teslin™ or polycarbonate (PC) will be described.

Teslin™ is a synthetic printing media, manufactured by PPG Industries. Teslin™ is a waterproof synthetic material that works well with an Inkjet printer, Laser printer, or Thermal printer. Teslin™ is also single-layer, uncoated film, and extremely strong. In fact, the strength of the lamination peel of a Teslin™ sheet is 2-4 times stronger than other coated synthetic and coated papers. Teslin™ comes in the sizes of 7 mil to 18 mil, though only sizes 10 mil and 14 mil are sized at 8.5" by 11", for printing with most consumer printers. Also available are perforated versions of Teslin, specifically, 2up, 6up, and 8up. Teslin™ is a microporous polymer. Polycarbonate (PC) is typically used for national ID cards, and also as the material in certain passports (such as for the Datapage, in contrast to the e-Cover).

The inlay substrate may have an area designated as a "transponder site" whereat the chip module and antenna will be installed. (A recess in the inlay substrate may constitute the transponder site.) The transponder site may itself have two areas designated as "terminals areas" corresponding in position to the two terminals of the chip module which will be installed at the transponder site. (The transponder site and terminal areas are generally geometric abstractions, the chip module and terminals are physical elements.) Hence, it should be understood that, where applicable, the terms (and reference numerals for) "transponder site" and "chip module" may be used interchangeably, and that the terms "terminal areas" and "terminals" may similarly be used interchangeably.

In the main hereinafter, RFID chips incorporated into chip modules will be described. The chip module may be a leadframe-type chip module comprising an RFID chip encapsulated by a mold mass and supported by and connected to a leadframe having two terminal areas.
  the mold mass may be approximately 240 μm thick and 5 mm wide
  the leadframe may be approximately 80 μm thick and 8 mm wide.

The chip module may be disposed in a recess extending into the surface of the substrate measuring for example 5.5 mm wide×8.5 mm high (generally the recess is only slightly larger than the chip module to allow some clearance during installation, while maintaining good registration).

The recess for receiving the chip module extends into the inlay substrate from a "top" surface thereof, and may be a "window" type recess extending completely through the inlay substrate to a "bottom" surface thereof, or the recess may be a "pocket" type recess extending only partially through the inlay substrate towards the bottom surface thereof.

The recess may have a "straight" profile—in other words, substantially constant cross-dimension through (or into) the inlay substrate. Or, the recess may have a "stepped" profile, including a larger cross-dimension at the top surface of the substrate than at (or towards) the bottom surface of the inlay substrate. The recess is generally sized and shaped to accommodate the size and shape of the chip module being disposed therein. The term "cavity" may be used interchangeably with "recess". A stepped recess profile is commonly used to accommodate a leadframe module, since the leadframe is typically wider (8-10 mm) than the mold mass (4-6 mm) of the chip module.

The antenna wire can be self-bonding copper wire or partially coated self-bonding copper wire, enamel copper wire or partially coated enamel wire, silver coated copper wire, uninsulated wire, aluminum wire, doped copper wire or Litz wire.

The conventional method of mounting the wire is using a sonotrode tool which vibrates, feeds the wire out of a capillary, and embeds it into the surface of the substrate. Examples of embedding a wire in a substrate, in the form of a flat coil, and an ultrasonic tool for performing the embedding (and a discussion of bonding), may be found in U.S. Pat. No. 6,698,089 (refer, for example, to FIGS. 1, 2, 4, 5, 12 and 13 of the patent). See also FIGS. 1 and 2 of U.S. Pat. No. 6,233,818. Both of these patents are incorporated by reference herein. It is also known that a coated, self-bonding wire will stick to a synthetic (e.g., plastic) substrate because when vibrated sufficiently to soften (make sticky) the coating and the substrate.

The conventional method for connecting the ends or end portions of the antenna wire to the terminals (or "terminal areas") of the chip module is by means of thermo compression (TC) bonding. This method makes use of heat by passing pulses of electric current through a thermode and simultaneously applying pressure to cause a diffusion process between the wire and the leadframe of the chip module.

FIGS. 1A and 1B illustrate an example of a prior art technique, such as is disclosed in U.S. Pat. No. 6,233,818 for mounting an antenna wire to an inlay substrate and connecting the antenna wire to a chip module installed in a recess in the inlay substrate.

An inlay sheet 100 is a large inlay substrate which may have a plurality of transponder areas (or sites), a one of which is shown in some detail. Typically, several transponders (or transponder sites) are fabricated on a single inlay sheet.

A recess 106 is formed in the inlay substrate 102 for receiving a leadframe type RFID chip module 108, positioned as shown, with the mold mass 112 situated below a leadframe 114. The recess 106 is illustrated as a pocket-type recess extending only partially through the inlay substrate 102, which is shown as a single layer substrate. The inlay substrate may comprise multi-layers, such as two layers as indicated by the dashed lines passing across the substrate. Compare FIG. 1F.

The leadframe 114 of the chip module 108 has two terminal areas 108a and 108b. An antenna wire 110 having two connection portions (ends or end portions) 110a and 110b is mounted on or to the inlay substrate 102 and connected to the terminal areas 108a and 108b of the chip module 108.

The antenna wire 110 may be mounted to the substrate using an ultrasonic embedding tool such as a sonotrode having a capillary 116. Mounting the antenna wire 110 may proceed as follows:

using the sonotrode, embed the wire a short distance, between the points "a" and "b" near a first terminal of the chip module. (embedding is indicated by the symbols "x")

stop embedding (raise the sonotrode), and pass over the first terminal 108a of the chip module 108, between the points "b" and "c".

lower the sonotrode and resume embedding at the point "c", and form the turns of the antenna between the points "c" and "d" (embedding is indicated by the symbols "x")

there may be for example 4 or 5 turns, and the overall length of the antenna wire may be 104 cm notice that in forming the turns of the antenna, the wire may need to cross over itself, thus requiring an insulated wire. However, in some cases, the antenna wire does not need to cross over itself. See, for example, FIG. 4 of U.S. Pat. No. 6,698,089.

after approaching near the second terminal 108b of the chip module 108, stop embedding and pass over the second terminal of the chip module, between the points "d" and "e".

resume embedding a short distance on the opposite side of the chip module, between the points "e" and "f".

The embedding process (between the points "c" and "d") may be discontinuous, at several points, rather than continuous.

In a next stage of the process, the "connection" portions of the wire passing over the terminal areas 108a and 108b are interconnected to the terminal areas of the chip module, typically by means of thermo compression bonding. (A first connection portion between the points "b" and "c" passes over the terminal 108a. A second connection portion between the points "d" and "e" passes over the terminal 108b.) A thermode 118 for performing bonding of the connection portions to the corresponding terminals is illustrated. It is known to remove insulation from the connection portions of the antenna wire to improve bonding.

In the case of an inlay substrate comprising Teslin™ (a synthetic paper), a normal insulated wire would not properly embed into the material, it would detach. Therefore, it is known to use self-bonding wire which attaches to the material with a slight penetration of the wire in the material.

A self-bonding (or self-adhering) wire may comprise a metallic core (typically, but not necessarily round in cross-section) comprising copper, aluminum, doped copper, gold, or Litz wire, and may have a diameter of 0.010-0.50 mm a first coating or "base coat" comprising modified polyurethane, and having a thickness of only a few microns a second coating comprising polyvinylbutyral or polyamide, and having a thickness of only a few microns The transponder thus formed on the inlay substrate may be incorporated, for example, in an electronic passport cover, as described hereinbelow.

Some Examples of Chip Modules

In the main hereinafter, the discussion may focus on RFID chip modules which are leadframe-type modules. However, some of the techniques for producing security documents discussed herein may also be applicable to epoxy glass modules (chip on FR4, wire bonded, glob topped).

FIG. 1C shows an example of an RFID chip module which is a "leadframe module" comprising:

a leadframe having a thickness of approximately 80 µm an RFID chip disposed on and connected by wire bonds to the leadframe, having a thickness of approximately 80 µm a mold mass disposed over the chip and wire bonds, having a thickness of approximately 240 µm an antenna wire having end portions connected to "connection areas" of the leadframe, typically on a side of the leadframe opposite the RFID chip (as shown), but the end portions can also be connected to connection areas on the same side of the lead frame as the RFID chip.

The total thickness of the leadframe module may be 320 µm, such as for an inlay substrate having a thickness of approximately 356 µm. Generally, the chip module will be disposed in a recess in the inlay substrate so as to be concealed therein.

FIG. 1D shows an example of an RFID chip module which is an "epoxy glass module" comprising:

an interconnect substrate, such as FR4 (printed circuit board substrate material), having a thickness of approximately 100 µm (FR4 is 100 µm and the chip & glob top 160 µm=overall 260 µm)

an RFID chip, wire-bonded (alternatively flip-chip connected with solder bumps and underfiller, as illustrated) to the FR4 substrate, having a thickness of approximately 100 µm a glob top epoxy disposed over the chip and connections, having a thickness with chip of approximately 160 µm an antenna wire having ends connected to "connection pads", typically on the same side of the FR4 substrate as the RFID chip, but can also be connected on the opposite side of the FR4 substrate as the chip.

The total thickness of the epoxy glass module may be 260 μm, such as for an inlay substrate having a thickness of approximately 365 μm. Generally, the chip module will be disposed in a recess in the inlay substrate so as to be concealed therein.

Generally speaking, epoxy glass modules are inherently somewhat more flexible than leadframe modules. This is a factor that may need to be taken into consideration when incorporating an RFID module into a secure document. And, whereas leadframe modules are typically rectangular, the mold part (glob top) of an epoxy glass module are typically round.

It should be understood that, although FIG. 1D shows a flip chip connection between the RFID chip and the FR4 substrate, the chip can be wire-bonded to the substrate (such as shown in FIG. 1C, for the leadframe-type module.)

Portions of the Antenna Wire

FIG. 1E shows a flat coil antenna structure having several (such as four or five turns) which may be formed of wire, such as self-bonding wire, and various portions of the resulting antenna structure, such as:

two ends which are generally the geometric "ends" of the elongate antenna wire
  two end segments which are generally short portions of the antenna wire at each end of the antenna wire. The end segments include the ends, and may be connected to the terminals of the chip module, such as in U.S. Pat. No. 6,088,230 or US 2010/0141453.
  two end portions which are also short portions of the antenna wire (exclusive of the ends or end segments) which may be connected to the terminals of the chip module, such as in U.S. Pat. No. 6,233,818 or U.S. Pat. No. 7,546,671.
  a main or intermediate portion which is the longest portion of the antenna wire, between the two end portions, and which may be formed into several turns of a flat coil antenna (the intermediate portion may be referred to as the "main body portion" of the antenna wire)

The "connection portions" of the antenna wire may be the ends (typically including end segments) or end portions (typically excluding end segments). In some embodiments, reference is made to "termination ends" of the antenna, which may mean substantially the same thing as "connection portions".

Some Examples of "Final Products"

Transponders such as are shown in FIGS. 1A and 1B may be considered to be "interim products" in that some further steps or elements may be needed before getting the product into the "hands of the consumer". For example, various cover layers may be laminated to the inlay substrate to protect (and secure) the transponder, as well as for imprinting with information. The end result, or "final product", may be a secure document such as an electronic passport booklet or a smart card.

FIG. 1F shows an example of a security document which may be a National ID (identification) Card (or electronic ID, "eID" card) comprising a multi-layer (2 layer) inlay substrate, and additional layers comprising a top overlay layer and a bottom overlay layer. An RFID chip module and corresponding antenna (not shown) may be mounted in the inlay substrate(s). The chip module (not shown) may have a mold mass and a leadframe. The additional top and bottom layers may be anti-scratch layers, and protect the inlay substrate(s). The eID card, inlay substrate layer and top and bottom layers are not shown to scale.

Some dimensions for and properties of the layers may be:

| Top overlay layer | transparent | 80 microns |
|---|---|---|
| Inlay substrate mold | white | 185 microns |
| Inlay Substrate - Lead | transparent | 80 microns |
| Bottom Overlay Layer | transparent | 80 microns |

The layers of the inlay substrate for a smart card may comprise PVC, which has limited life. Smart cards are often replaced (renewed) every few years.

The layers of the inlay substrate for a national ID care may comprise PC (polycarbonate), which may be more durable (longer life) than PVC (polyvinyl chloride).

FIGS. 1G, 1H, 1I illustrate an exemplary construction for an electronic passport cover, corresponding generally to the single layer inlay substrate construction shown in FIG. 1B. The inlay substrate for a US passport may comprise Teslin™.

A cover layer may be disposed over the inlay substrate for the final product. The material for the cover layer may be a cloth product, with chemistry in the coatings and a leather-like appearance to the cloth, such as by Holliston Inc. (905 Holliston Mills Road, Church Hill, Tenn. 37642; www.holliston.com)

The cover layer may be laminated (joined) to the inlay substrate using a polyurethane hot melt adhesive, such as approximately 50-80 μm thick. Prior to the adhesive process, the inlay substrate may be pre-pressed to ensure that the antenna wire does not protrude over (extend above) the surface of the Teslin™ substrate, in other words, to ensure that the antenna wire is fully embedded in the inlay substrate.

With reference to FIG. 1H, in variations of the construction shown for an electronic passport cover (a similar secure document), the inlay substrate may be multi-layer, and if the recess extends completely through the inlay substrate, an underlying bottom layer may be provided to support the chip module.

Some dimensions for and properties of the layers of a passport cover may be:

| cover layer | cloth | 350 microns |
|---|---|---|
| Inlay substrate | Teslin ™ | 356 microns |

Mounting the Antenna to the Inlay Substrate

Various methods are known for mounting an antenna wire to the inlay substrate, and can generally be divided into two categories:

(i) "coil winding", which comprises forming the antenna wire separately from the inlay substrate and installing the preformed antenna wire (sometimes with the chip module already mounted to ends of the antenna wire) thereto, and
  (ii) "common substrate", which comprises forming the antenna wire on the inlay substrate by scribing (typically ultrasonic embedding), and connecting ends or end portions of the antenna wire to terminal areas of the chip module Some of these techniques are described in the following patents and/or publications, all of which are incorporated by reference in their entirety herein.

U.S. Pat. No. 5,809,633 (Mundigl et al.), incorporated in its entirety by reference herein, discloses a method for producing a smart card module for contactless smart cards. As disclosed therein:

A method for producing a smart card module includes bonding one end of a thin wire onto a first contact zone of a semiconductor chip. The wire is guided in a plurality of turns forming an antenna coil. The wire is bonded onto a second contact area of the semiconductor chip. The wire turns of the antenna coil and the semiconductor chip are placed on a carrier body. (Abstract)

Referring now in detail to the single FIGURE of the drawing, there is seen a flat carrier body 1 which is made of flexible, non-conductive material and has a recess 2. A semiconductor chip 3 is inserted into the recess. The semiconductor chip 3 has two contact zones 4 which are enlarged in comparison with the customary chip contact zones through the use of a gold plating, for example. Connections 6 of an antenna coil 5 are secured on the contact zones 4 through the use of bond contacts. The antenna coil 5 is a wire which is advantageously made of aluminum. In this case, the wire has initially been bonded onto one of the contact zones 4, then wound through the use of a guiding head of an automatic wire-winding machine, into which a bonding device is integrated, in a plurality of turns to form the coil (only two turns are illustrated in the FIGURE, but there may also be more) and finally bonded again onto the other contact zone. The semiconductor chip 3 with the coil 5 which is secured thereto in an inventive manner is subsequently inserted into the recess 2 in the carrier body 1, with the result that the coil 5 is disposed on the carrier body 1. (column 2, lines 35-54)

A known method of transferring a wire antenna onto or into a substrate is first to wind a coil on a mechanical fixture which includes a mechanism to hold an RFID chip in position, and through rotation of the tool a coil is formed with its wire ends positioned over the terminal areas of the chip (or chip module) for interconnection. For example, See EP 0 839 360, incorporated by reference herein. The antenna wire can be self-bonding wire which, when heated during the rotation of the coil winding tool, would form an antenna in which the turns of wire may be adhesively attached to one another.

U.S. Pat. No. 6,295,720 (Finn et al.), incorporated in its entirety by reference herein, describes a procedure of forming an antenna in a radial coil winding tool and mounting a chip in the tool before winding so as to arrange the wire ends of the coil over the terminal areas of the chip and then connecting the wire ends of the coil to the chip before placing the transponder (coil and connected chip) onto a substrate. See also EP 0 922 289, WO98/09305, PCT/DE97/017712).

EP 0 839 360 (Finn et al.), Verfahren and Vorrichtung zur Herstellung eines IC-Kartenmoduls, incorporated in its entirety by reference herein, discloses another coil winding technique. See also WO97/04415 (PCT/DE96/01121).

EP 1 352 551 (Michalk), incorporated in its entirety by reference herein, describes a procedure for fitting conductor wires on or in a substrate, with a conductor wire arrangement created outside the substrate before subsequently pressing the wire arrangement into said substrate, by first applying a pattern of conductor wire on a tensioning frame with the conductor wire being tightened in parallel or almost in parallel to the pressing plane of the tensioning frame via tensioning elements having a predefined pattern, and the conductor wire pattern being subsequently pressed and fixed in or on the substrate characterized in that during the pressing of the conductor wire pattern into the substrate, the tensioning elements slide back according to the pressing movement and release the conductor wire pattern, and in that the axially movable tensioning elements are pushed forward one after the other according to the conductor wire arrangement to be created from the pressing plane one after the other starting from the inside part of the conductor wire arrangement, thus creating the conductor wire pattern arrangement by a winding process.

To interconnect the wire ends of the wound coil to an RFID chip, the above procedure proposes that the electronic component be contacted on the tensioning frame with the conductor wire ends, and be pressed into the substrate together with the coil.

The procedure of forming a wire antenna or transponder unit using a coil winding process and then pressing the coil into a substrate by means of heat and pressure is highly unreliable, slow and difficult to automate for volume production. The tooling is also subject to wear and tear resulting in coils having different geometrical dimensions. One major disadvantage of this technique is the inability to form an antenna with a large pitch between the wire conductors which form the antenna.

U.S. Pat. No. 6,088,230, incorporated in its entirety by reference herein, overcomes some of the technical issues associated in using the technique of coil winding to produce a transponder site on a substrate. It describes a method of arranging a transponder site comprising at least one chip and one wire coil on a substrate, in particular a substrate used to produce a chip card, in which the chip and the wire coil are disposed on a common substrate and the coil wire ends are bonded to terminal areas of the chip on the substrate characterized in that the coil is formed by laying a coil wire in a wiring plane on the substrate, with the coil wire being bonded to the substrate at least at some points. See also EP 0 753 180

This technique of laying a wire onto or into a substrate and forming an antenna for connection to an RFID chip in producing a transponder site is known as "wire embedding", and comprises using ultrasonic energy (delivered by a sonotrode) to stick the wire to or countersink the wire partially or entirely into a synthetic substrate (the inlay substrate).

Furtherer examples of the common substrate technique can be found in U.S. Pat. No. 6,233,818 (Finn et al.) and subsequent U.S. Pat. No. 6,698,089 (Finn et al.), both of which are, incorporated in its entirety by reference herein. Generally, as disclosed therein, Process and device for the contacting of a wire conductor (113) in the course of the manufacture of a transponder unit arranged on a substrate (111) and comprising a wire coil (112) and a chip unit (115), wherein in a first phase the wire conductor (113) is guided away via the terminal area (118, 119) or a region accepting the terminal area and is fixed on the substrate (111) relative to the terminal area (118, 119) or the region assigned to the terminal area, and in a second phase the connection of the wire conductor (113) to the terminal area (118,119) is effected by means of a connecting instrument (125). (Abstract, '818)

U.S. Pat. No. 6,233,818 discloses a conventional technique for mounting and connecting an antenna wire. FIGS. 4 and 5 of this patent show that a first end of the antenna wire starts on the substrate, passes over a first chip terminal, then continues on the substrate to form the (4 or 5) turns of the antenna, then passes over the second chip terminal, then terminates on the substrate.

U.S. Pat. No. 6,088,230 discloses a procedure for producing a transponder unit (55) provided with at least one chip (16) and one coil (18), and in particular a chip card/chip-mounting board (17) wherein the chip and the coil are mounted on one common substrate (15) and the coil is formed by installing a coil wire (21) and connecting the coil-wire ends (19, 23) to the contact surfaces (20, 24) of the chip on the substrate.

A wire embedding technique may be found in U.S. Pat. No. 6,626,364 (Taban), incorporated in its entirety by reference herein.

Although these common substrate techniques represent a significant improvement over coil winding in terms of antenna quality and throughput, they have the disadvantage that different inlay formats (such as the pattern of the antenna coil) require significant mechanical alterations to the production equipment resulting in downtime and inefficient use of the equipment, in particular where the number of transponder sites on a format is very low, as is the case in the production of inlays for electronic passports ("2up" or "3up" formats).

U.S. Pat. No. 7,229,022 (Rietzler), incorporated in its entirety by reference herein, discloses method for producing a contactless chip card and chip card produced according to said method. As disclosed therein:

The invention relates to a method for producing a transponder, especially a contactless chip card (1) comprising at least one electronic component (chip module 2) and at least one antenna (3); the at least one electronic chip component (2) being disposed on a non-conducting substrate that serves as a support for the component. The at least one antenna is also disposed on a non-conducting substrate, the at least one electronic component (2) being applied to a first substrate and the antenna (3) on a second substrate. The entire circuit (1) is then produced by joining the individual substrates so that they are correctly positioned relative to each other. The components (2, 3) are contacted once the different substrates have been joint by means of auxiliary materials such as solder or glue, or without auxiliary materials by microwelding. The non-conducting substrates form a base card body. (Abstract)

FIG. 3 shows the individual substrate before the assembly in the use arrangement. Substrate 11 supports the antenna 12, whereby this is arranged exactly in the defined use arrangement and position. On the antenna substrate, assistance lines 13 can be applied, which simplify the orientation on one another of both substrates. The antennae 12 lie on the underside of the substrates, that is, on the side facing toward the second substrate. The second substrate 14 shows the substrate on which the chip modules 15 already are mounted. The chip modules are already fixed onto the substrate by means of the previously described method. The chip modules 15 lie on the top side, that is, on the side of the substrate facing the antennae 12.

For further processing, both substrates 11 and 14 are oriented to be correctly position and pressed onto one another.

FIG. 4 shows the view of the joined substrates of a transponder in cross section. One recognizes the lower substrate 16 on which the chip module 17 is arranged. Opposite is the upper substrate 20, which supports the antenna 19 on its underside. In the contact region 18, the antenna 19 and the contact surfaces 23 of the chip module overlap. At this point, the electrical connection is formed.

In this view, additionally an equalizing substrate 21 is shown. This substrate does not support any components, rather contains only an opening 22, in which the chip module 17 comes to rest after the assembly process. (column 5, lines 11-37)

US 2008/0314990 (Rietzler), incorporated in its entirety by reference herein, discloses chip card and method for the production of a chip card. See also WO07/065,404. As disclosed therein, The invention pertains to a chip card and to a method for producing a chip card with a chip module that is contacted with an external contact arrangement arranged in the contact surface of a card body, as well as with an antenna device arranged in a card inlay, wherein the card inlay is initially produced in a first production device and the card inlay is subsequently provided with at least one respective external layer on both sides in a second production device, namely in such a way that the external contact arrangement arranged on the external contact side of the chip carrier is introduced into a recess of the assigned external layer, and wherein a connection between the card inlay and the external layers is subsequently produced in a laminating process. (Abstract)

FIG. 1 shows an arrangement of a plurality of so-called panel sheets that respectively feature a plurality of layers interconnected in one piece in the form of a panel arrangement in order to produce a card inlay sheet 10 according to FIG. 5 with a plurality of interconnected card inlays 11. FIG. 1 specifically shows a receptacle layer sheet 12 with a plurality of interconnected receptacle layers 13 and a cover layer sheet 14 with a plurality of interconnected cover layers 15.

The receptacle layer sheet 12 and the cover layer sheet 14 are situated between a lower laminator plate 17 and an upper laminator plate 18 of a laminator arrangement 16. The lower laminator plate 17 is provided with an arrangement 19 of recesses 20 corresponding to the panel arrangement of the receptacle layer sheet 12 and serving for accommodating a corresponding number of chip modules 21.

The receptacle layers 13 of the receptacle layer sheet 12 respectively serve as antenna substrates, on which one respective antenna device 22 with several antenna windings 23 is arranged, namely in the form of a wire arrangement in the example shown. The antenna devices 22 respectively feature two contact ends 24, 25 that extend over contacting bays 26 in an opening edge 27 of a recess 28.

The receptacle layer sheet 12, as well as the cover layer sheet 14, consists of a plastic material that can be laminated such as, for example, polyethylene or PVC.

The Rietzler references (U.S. Pat. No. 7,229,022 and US 2008/0314990) may be considered to be a "modified" form of coil winding in that antenna structures are formed on a substrate other than the inlay (chip module containing) substrate.

In the teachings of U.S. Pat. No. 7,229,022 and US 2008/0314990 an array of antennae are installed on a separate substrate to the substrate hosting the RFID chips with an identical format. The antenna substrate is then placed over the substrate with the array of RFID chips and the termination areas of each antenna are manually connected to each chip on the respective transponder site. It is worth noting that the wire ends of each antenna span a bridge over an opening in the antenna substrate and therefore a distance remains between the wire bridges over the opening and the chip modules on the other substrate. A difficulty with such a method is alignment of the wire ends with the terminal areas of a chip module, which may require manually aligning the wire ends for interconnection by hand.

SUMMARY

A method of mounting at least one antenna structure to an inlay substrate comprising first forming the at least one antenna structure on an antenna substrate, then transferring the at least one antenna structure to corresponding at least one selected transponder sites on an inlay substrate. The antenna substrate may be in an elongate web form, and the antenna structures may be transferred one-by-one to selected transponder sites on the inlay substrate. The inlay substrate may carry an array of antenna structures which may be transferred en masse to a corresponding array of transponder sites on the inlay substrate. Various techniques for effecting the transfer are disclosed herein, such as (but not limited to) using a pick & place machine, causing antenna structures to be released from the antenna substrate, a contact transfer process. The antenna structure may comprise a wire conductor, electronic ink, conductive paste, electrically charged nano-particles or any conductive medium. Channels may be formed in the antenna substrate for the antenna structure. A wide trench may be formed in the inlay substrate for accepting the antenna structure.

An antenna structure may be electrically connected to terminal areas of the chip or chip module previously installed at the transponder site either during or after the transfer process (in the same or a subsequent step). The chip module may be joined with an antenna structure while the antenna structure is resident on the antenna substrate, then the antenna structure and chip module transferred together to the inlay substrate. Typically, the chip module will reside in a recess at the transponder site on the inlay substrate. The antenna structure may reside in a wide trench formed at the transponder site on the inlay substrate.

A plurality of antenna structures may be incorporated into a plurality of transponder sites by arranging (forming) a plurality of antenna structures with several conductor turns on a synthetic antenna substrate (carrier layer or film), removing the antennas and their termination ends from the antenna substrate by means of die punching, laser cutting or laminating (contact transfer), and transferring the antennas with their termination ends in a fixed and aligned position for mounting onto or into (a wide trench) an inlay substrate, and subsequently connecting the aligned termination ends of the antenna structure to terminal areas of an RFID chip (or chip module) disposed on or in (a recess in) the inlay substrate.

A method for arranging an antenna structure on or in an inlay substrate being monolayer or multi-layer with the antenna structure arranged on an antenna substrate (carrier layer) which is separate from the inlay substrate, and antenna structure being removed from said carrier layer before placing the antenna structure onto or into (a recess in) the inlay substrate by
  first, mounting a wire conductor on or into the carrier layer such as by means of ultrasonic embedding, forming an antenna and routing termination ends of the antenna to pre-defined positions on the carrier layer for later alignment with the terminal areas of the RFID chip (or chip module);
  second, removing the antenna structure from the carrier layer with its termination ends pre-positioned by application of heat and pressure, mechanical pressure, punching or laser cutting;
  third, transferring the antenna structure to the inlay substrate hosting an RFID chip (or chip module) on or in the inlay substrate, fixing the antenna structure to the inlay substrate and connecting the termination ends (connection portions) of the antenna structure to the terminal areas of the RFID chip (or chip module) to produce a transponder site.
An overall process may include:
  a plurality of antenna structures (each as a flat coil having 4 or 5 turns, and two termination ends) may be pre-formed on the antenna substrate (carrier film), which may be in the form of a long web.
    this enables prefabricating a plurality (such as a row) of antenna structures independently of preparing another plurality (such as an array) transponder sites on an inlay substrate, and later "joining" the pre-formed antenna structures to the transponder site (and connecting to the antenna structures to the chip modules on the transponder sites).
  individual antenna structures may be separated (singulated) from the carrier film by cutting (perforating) around the inner and outer edges of the antenna structure. This may leave some "residual" carrier film material between turns of the antenna.
    connection portions of the antenna wire may be supported (aligned) by residual carrier film material.
    potions of the carrier film at the connection portions may be removed, such as by laser ablation, to facilitate subsequent bonding of the connection portions to terminals of the chip module.
  the singulated antenna structures may be installed on corresponding transponder sites on an inlay substrate, one-by-one, until all of the transponder sites are populated with antenna structures.
    the turns of the antenna structure, which form a "ring" (having an outer periphery and an inner periphery), may be installed in a wide trench which has been formed (such as by laser ablation) in the inlay substrate.
  after the antenna is installed on (or in a trench in) the inlay substrate, connection portions of the antenna structure may be connected to corresponding terminals (terminal areas) of the chip module, such as by using conventional bonding techniques.
    The connection portions may be the ends of the antenna wire (including for example 1 mm end segments of the antenna wire), or end portions of the antenna wire (exclusive of the last few mm of the antenna wire).

An aspect of the current invention is the fact that an antenna structure having a number (such as 4 or 5) turns of antenna wire turns is mounted on a carrier layer (substrate) which supports the flat coil shape of the antenna, the pitch between wires or tracks and the rigidity of the assembly.

Other objects, features and advantages may become apparent in light of the following descriptions of various embodiments of the invention.

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
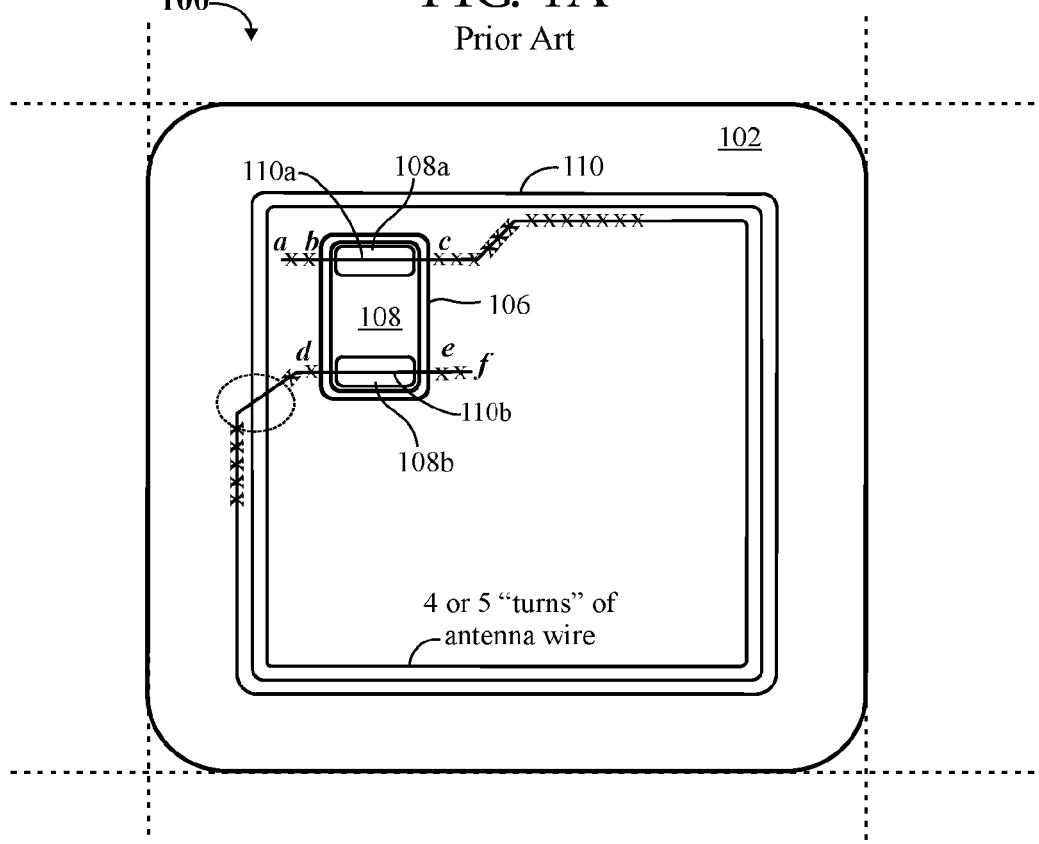

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures (FIGs.) may be referred to by similar reference numerals. For example, the element 199 in FIG. 1 may be similar (and possibly identical) to the element 299 in FIG. 2. Throughout the figures, each of a plurality of similar elements 199 may be referred to individually as 199*a*, 199*b*, 199*c*, etc. Such relationships, if any, between similar elements in the same or different figures will become apparent throughout the specification, including, if applicable, in the claims and abstract.

FIG. 1A is a top view of a transponder site (one of many on an inlay substrate or sheet), according to the prior art.

Figure 1B:
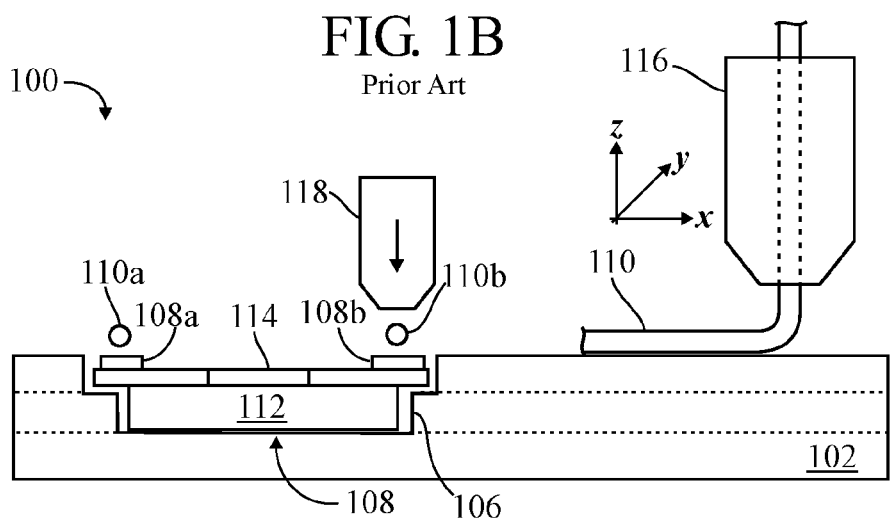

FIG. 1B is a side, cross-sectional view, partially exploded, of a wire being mounted to an inlay substrate and bonded to the terminals of a transponder chip, according to the prior art.

Figure 1C:
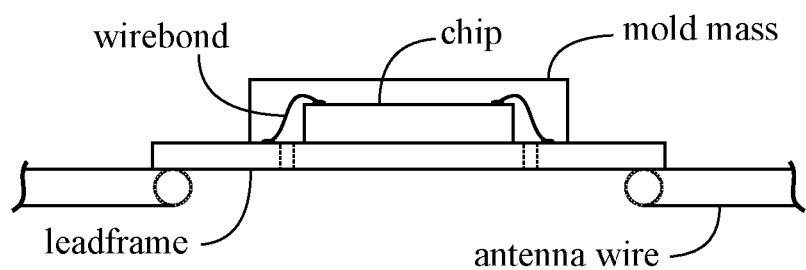

FIG. 1C is a side, cross-sectional view illustrating a construction of a leadframe type chip module, according to the prior art.

Figure 1D:
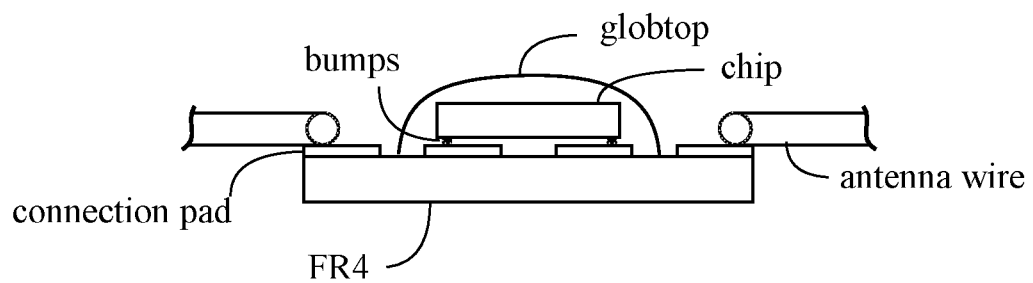

FIG. 1D is a side, cross-sectional view illustrating a construction of an epoxy glass type chip module, according to the prior art.

Figure 1E:
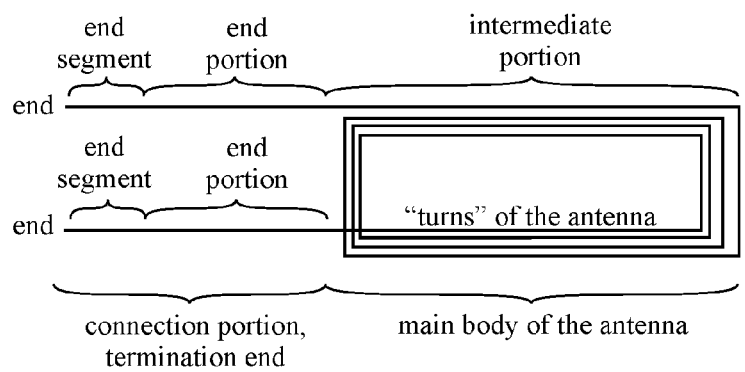

FIG. 1E is a schematic view of an antenna formed with a number of turns, illustrating various "portions" of the antenna structure which may be referred to in various descriptions.

Figure 1F:
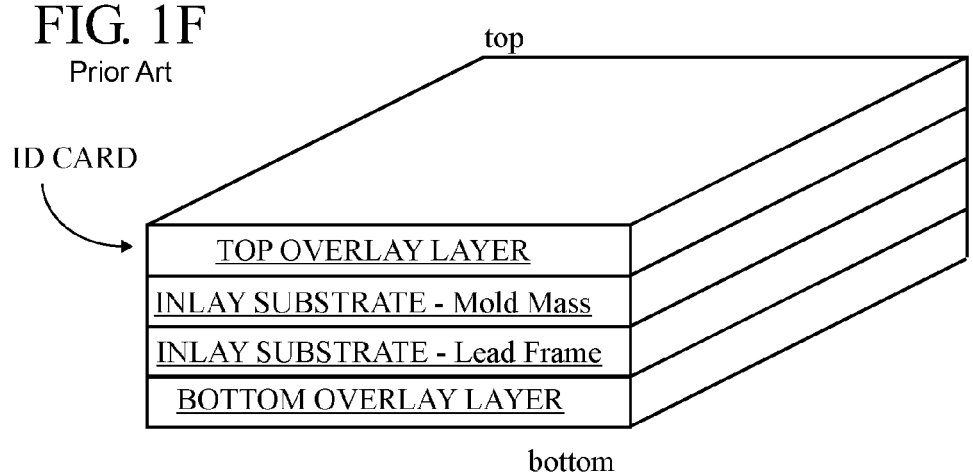

FIG. 1F is perspective view of a secure document which is an electronic ID care, according to the prior art.

Figure 1G:
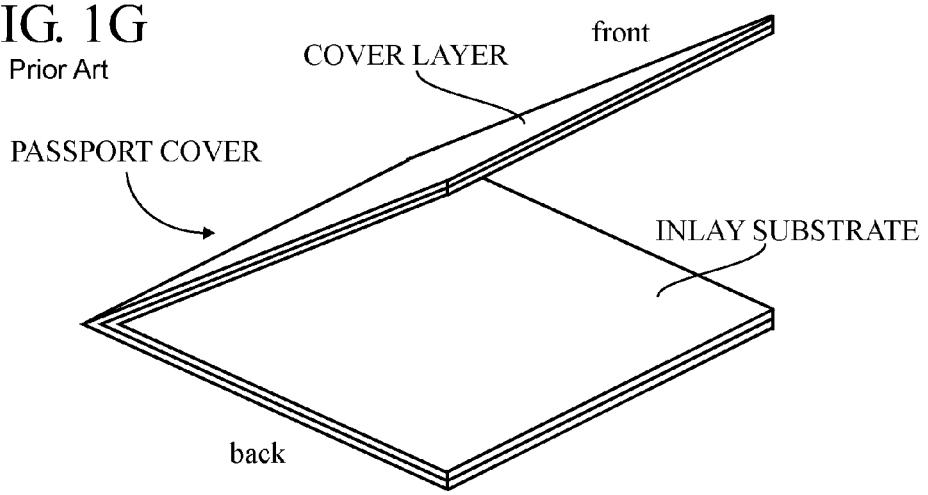

FIG. 1G is a perspective view of a secure document which is an electronic passport cover, according to the prior art.

Figure 1H:
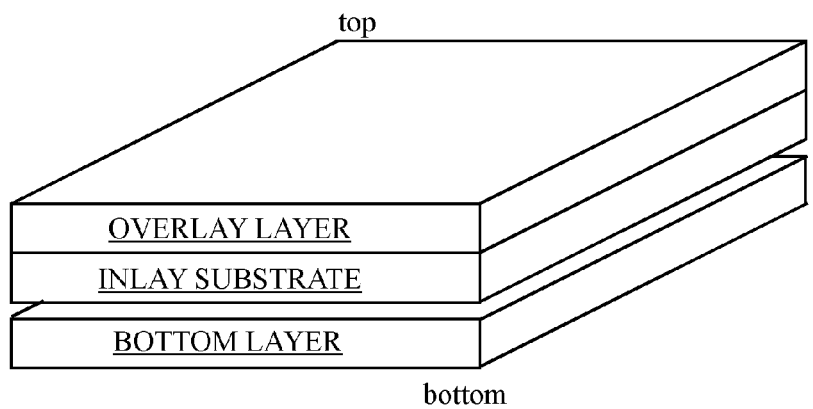

FIG. 1H is a cross-sectional view of the passport cover shown in FIG. 1G.

Figure 1I:
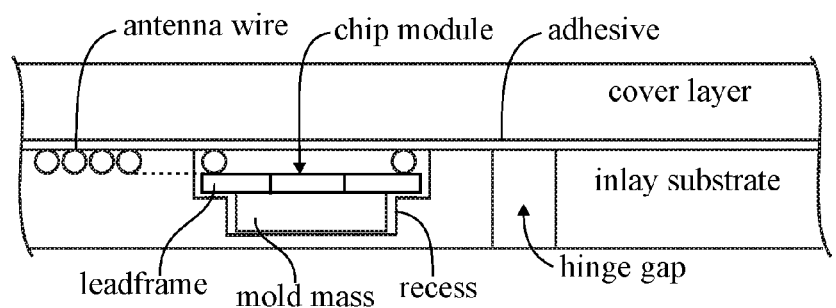

FIG. 1I is a side, cross-sectional view, partially exploded, of an antenna wire being mounted to an inlay substrate and bonded to the terminals (terminal areas) of an RFID chip (or chip module, also "transponder chip"), which may be the passport cover of FIG. 1H, according to the prior art.

Figure 2A:
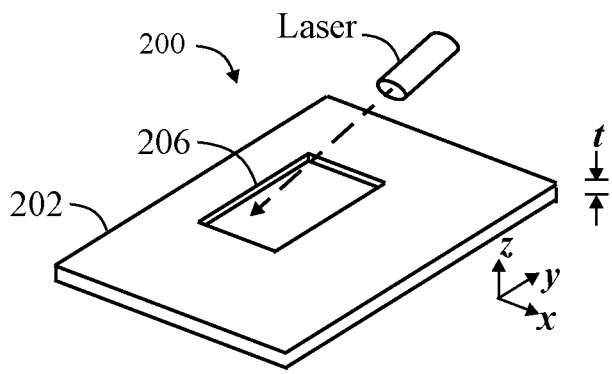

FIG. 2A is a perspective view showing a substrate (which may be an inlay substrate) having a recess formed therein, according to an embodiment of the invention.

Figure 2B:
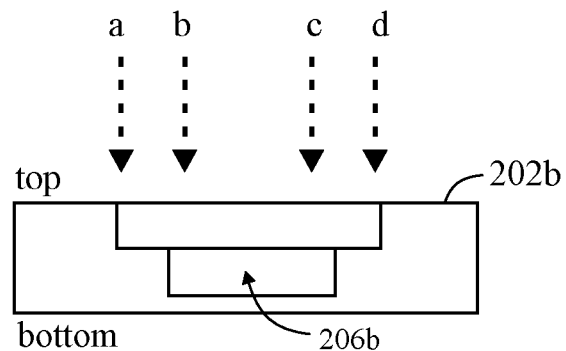

FIG. 2B is a cross-sectional view showing a substrate (which may be an inlay substrate) having a recess formed therein, according to an embodiment of the invention.

Figure 2C:
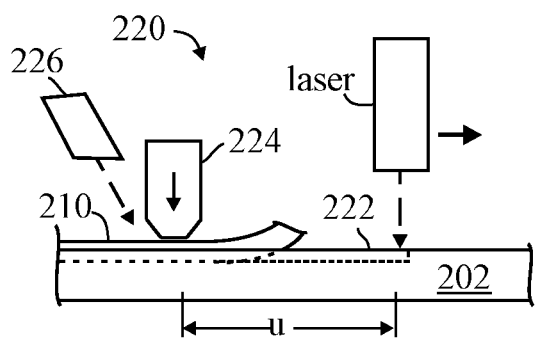

FIG. 2C is a partial perspective view showing a substrate (which may be an inlay substrate) having a channel formed therein, and laying a wire in the channel, according to an embodiment of the invention.

Figure 2D:
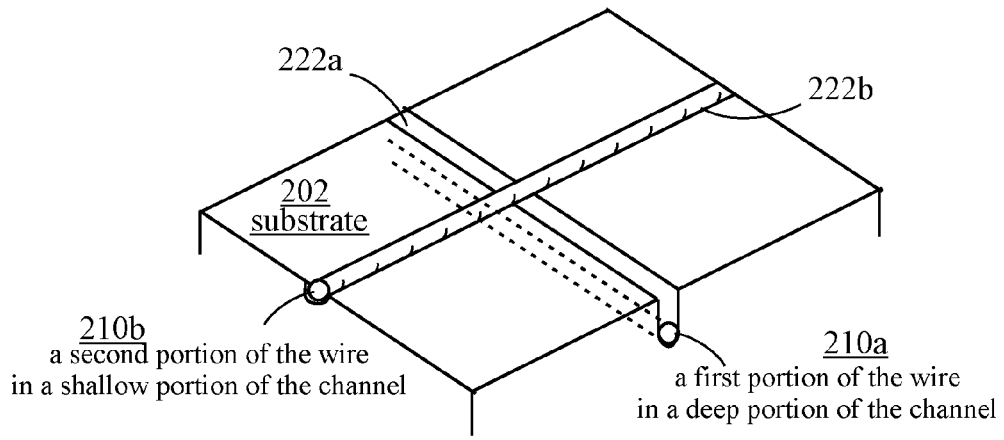

FIG. 2D is a partial perspective view showing a substrate (which may be an inlay substrate) having channels, portions of which cross over one another, and antenna wire (or portions thereof) in the channels, according to an embodiment of the invention.

Figure 2E:
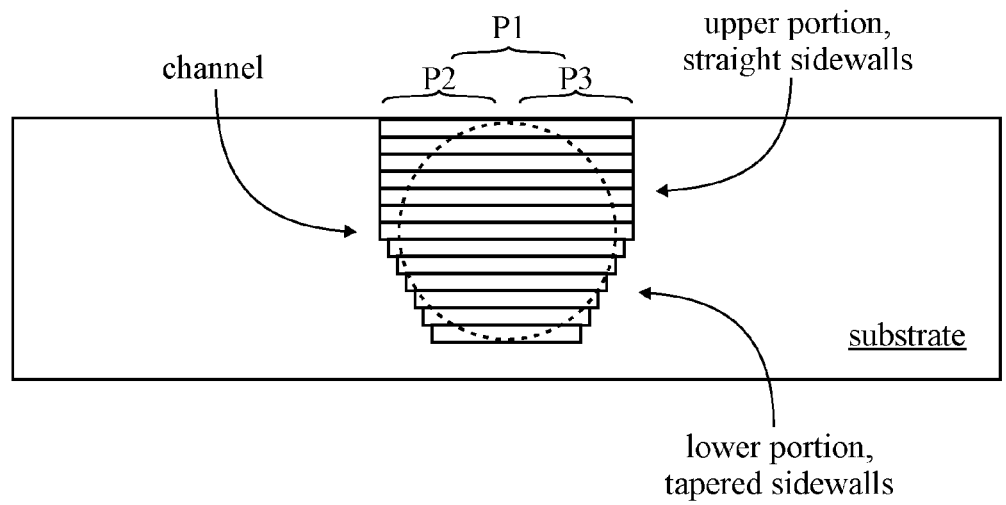

FIG. 2E is a cross-sectional view of a substrate (which may be an inlay substrate) illustrating a process for forming a channel which is profiled to receive a wire which is at least partially embedded in the channel, according to an embodiment of the invention.

Figure 2F:
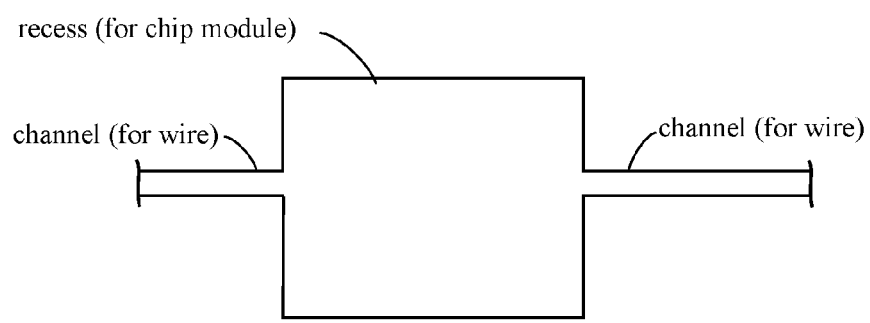

FIG. 2F is a top schematic view of a recess in a substrate, and channels extending from (opposite) edges of the recess.

Figure 2G:
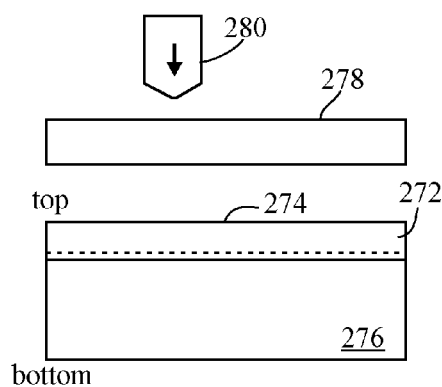

FIG. 2G is a cross-sectional view illustrating mounting an antenna wire in a channel, according to an embodiment of the invention.

Figure 2H:
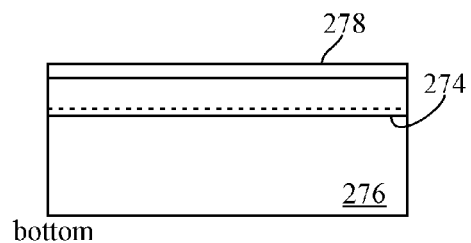

FIG. 2H is a cross-sectional view illustrating an antenna wire mounted in a channel, according to an embodiment of the invention.

Figure 2I:
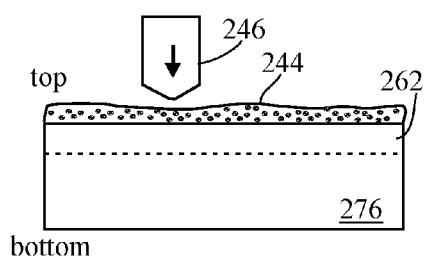

FIG. 2I is a cross-sectional view illustrating a flowable, conductive material being applied on a surface of a substrate to fill a channel, according to an embodiment of the invention.

Figure 2J:
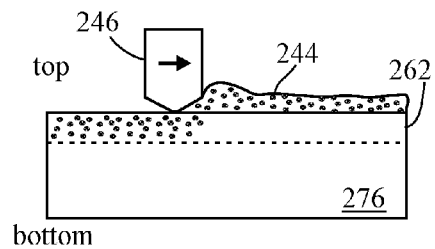

FIG. 2J is a cross-sectional view illustrating a further step in the technique of applying a flowable, conductive material on a surface of a substrate to fill a channel, according to an embodiment of the invention.

Figure 2K:
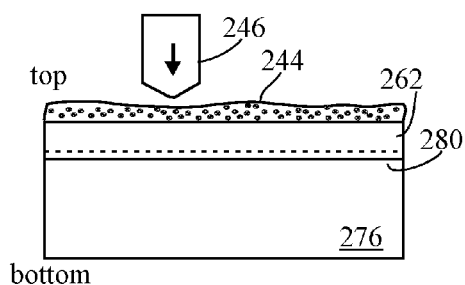

FIG. 2K is a cross-sectional view illustrating a flowable, conductive material being applied to fill a channel in a layer of adhesive, according to an embodiment of the invention.

Figure 2L:
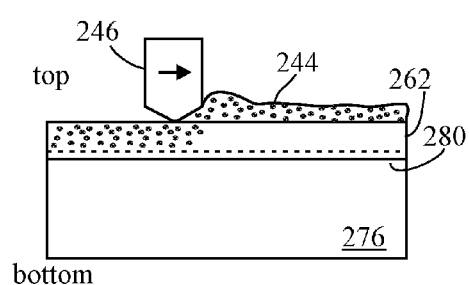

FIG. 2L is a cross-sectional view illustrating a further step in the technique of applying a flowable, conductive material to an adhesive layer to fill a channel, according to an embodiment of the invention.

Figure 3A:
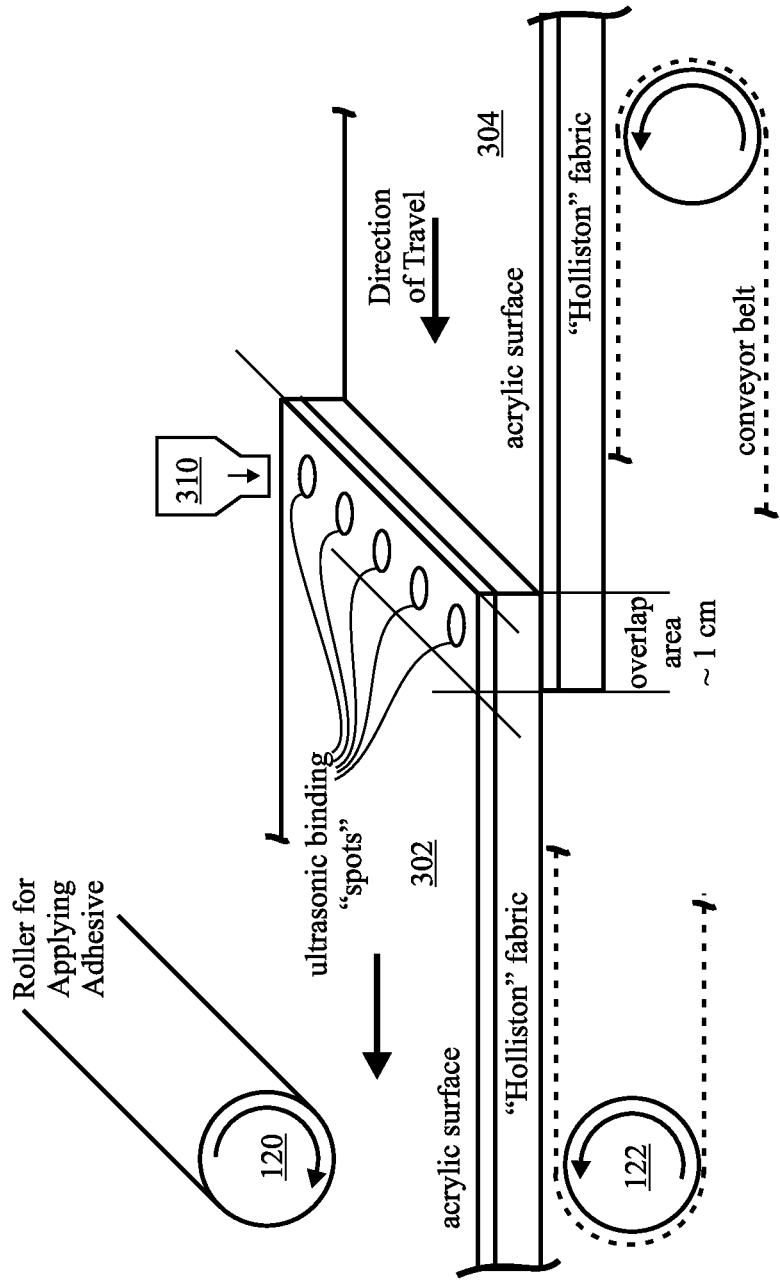

FIG. 3A is a partial perspective view of a technique for joining sheets in to a web, according to an embodiment of the invention.

Figure 3B:
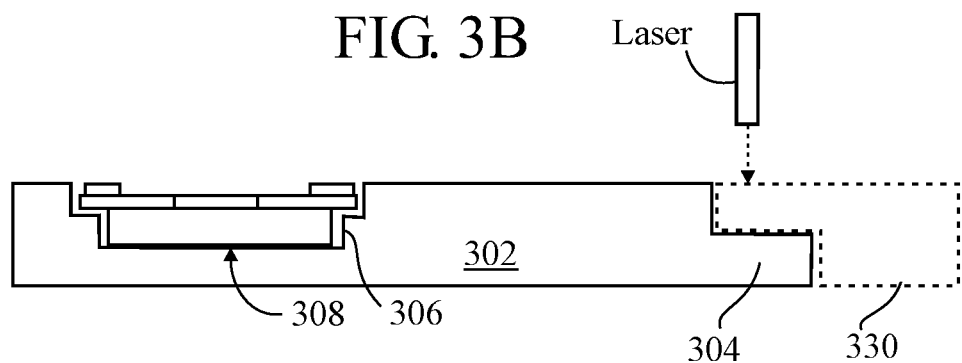

FIG. 3B is a cross-sectional view of a technique for thinning an edge region of a substrate, according to an embodiment of the invention.

Figure 3C:
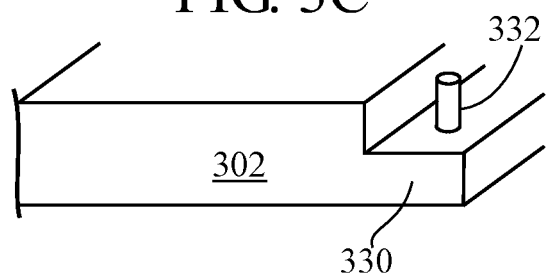

FIG. 3C is a partial perspective view of a technique for forming raised features (such as studs) in an edge region of a substrate, according to an embodiment of the invention.

Figure 3D:
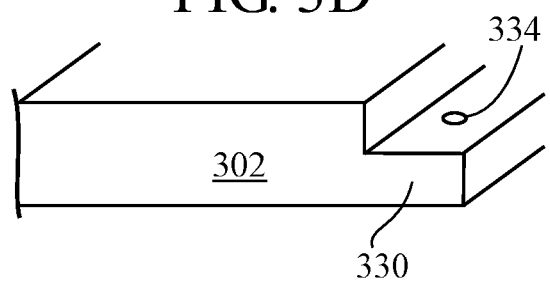

FIG. 3D is a partial perspective view of a technique for forming features such as holes for receiving studs in an edge region of a substrate, according to an embodiment of the invention.

Figure 3E:
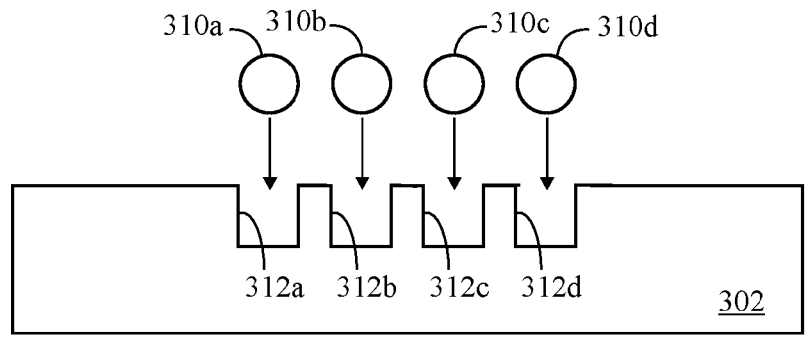

FIG. 3E is a cross-sectional view of a technique for forming channels in a substrate, such as for receiving individual turns of an antenna structure, according to an embodiment of the invention.

Figure 3F:
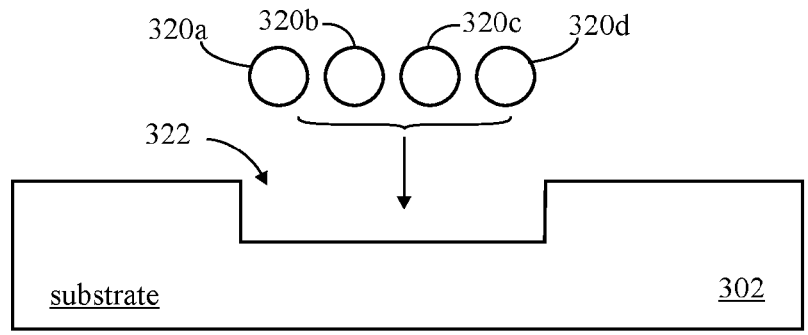

FIG. 3F is a cross-sectional view of a technique for forming a wide trench in a substrate, such as for receiving an entire antenna structure, according to an embodiment of the invention.

Figure 3G:
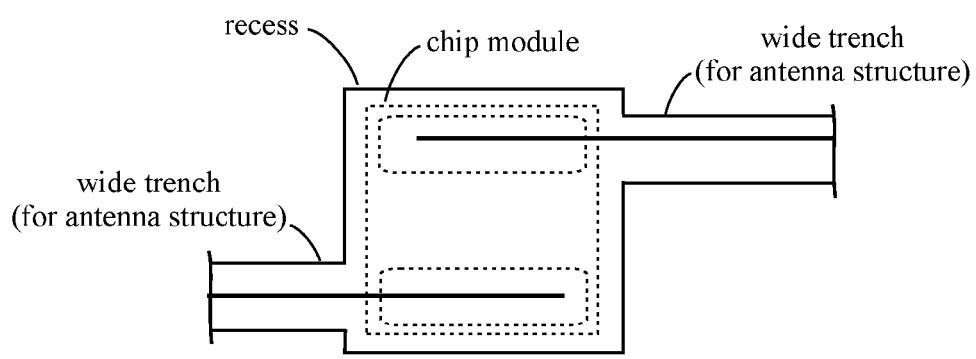

FIG. 3G is a top view of a portion of an inlay substrate showing a recess for receiving a chip module (CM) and channels extending from edges of the recess, according to an embodiment of the invention.

Figure 3H:
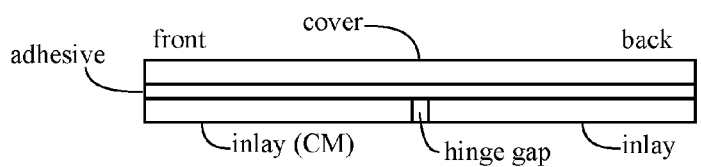

FIG. 3H is a cross-sectional view of a secure document such as an electronic passport cover, according to an embodiment of the invention.

Figure 3I:
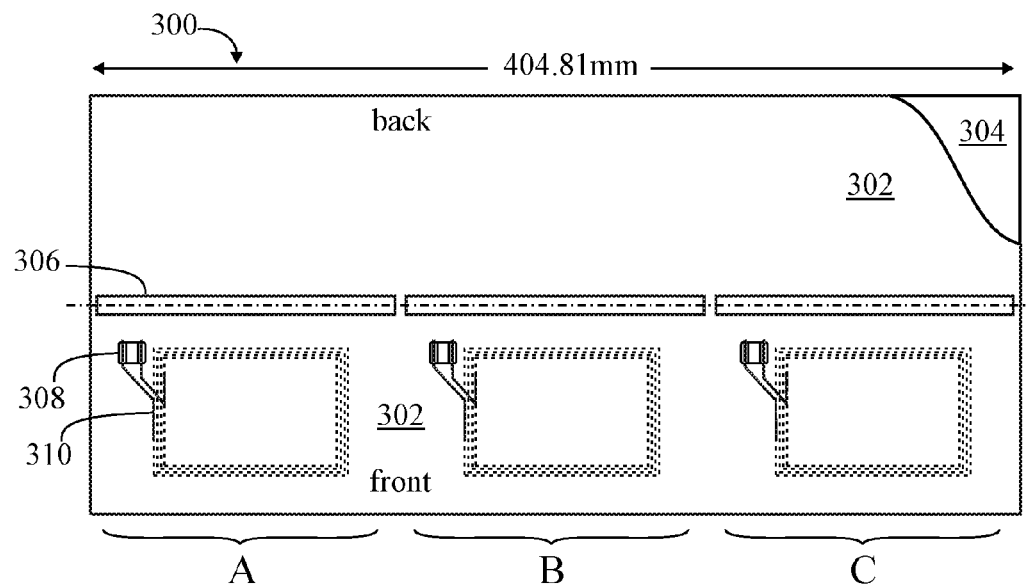

FIG. 3I is a top view of an inlay for forming a plurality of secure documents such as electronic passport covers, according to an embodiment of the invention.

Figure 3J:
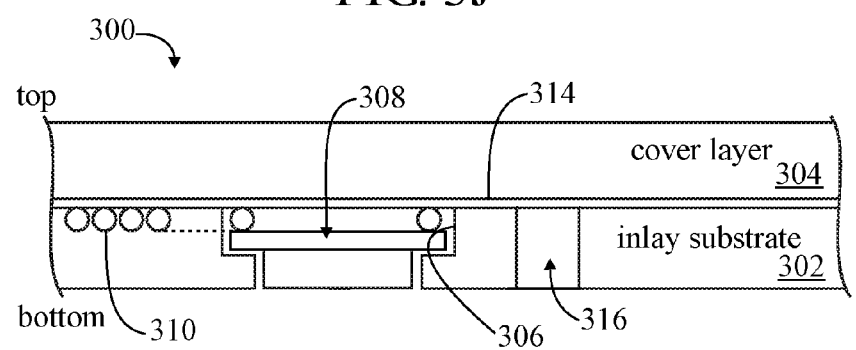

FIG. 3J is a cross-sectional view of a secure document such as an electronic passport cover, according to an embodiment of the invention.

Figure 3K:
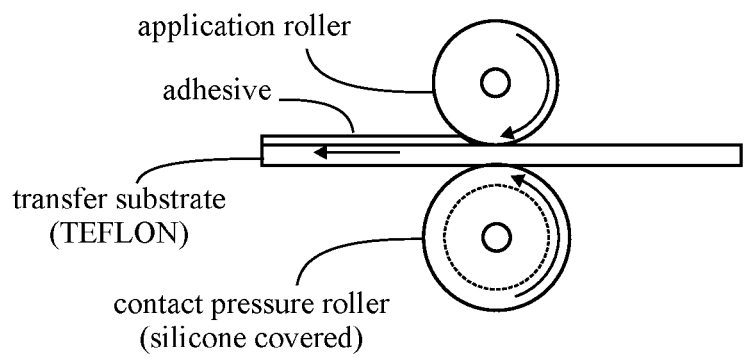

FIG. 3K is a cross-sectional view of a step in a technique for applying adhesive to a layer of passport cover material, according to an embodiment of the invention.

Figure 3L:
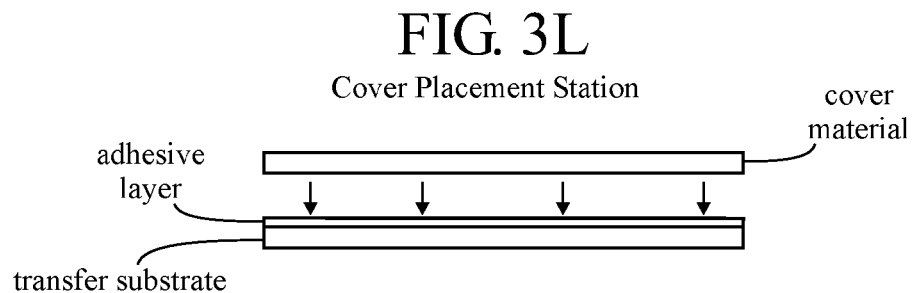

FIG. 3L is a cross-sectional view of a further step in a technique for applying adhesive to a layer of passport cover material, according to an embodiment of the invention.

Figure 3M:
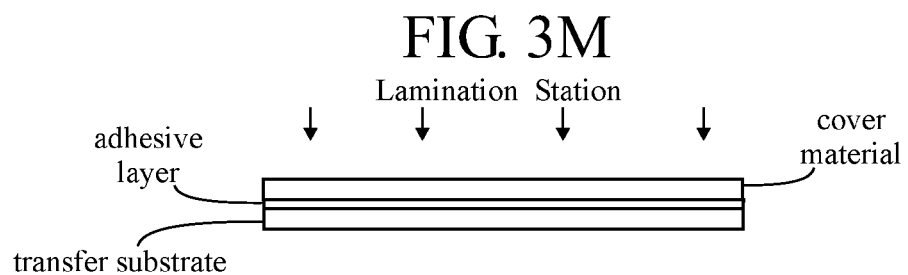

FIG. 3M is a cross-sectional view of a further step in a technique for applying adhesive to a layer of passport cover material, according to an embodiment of the invention.

Figure 3N:
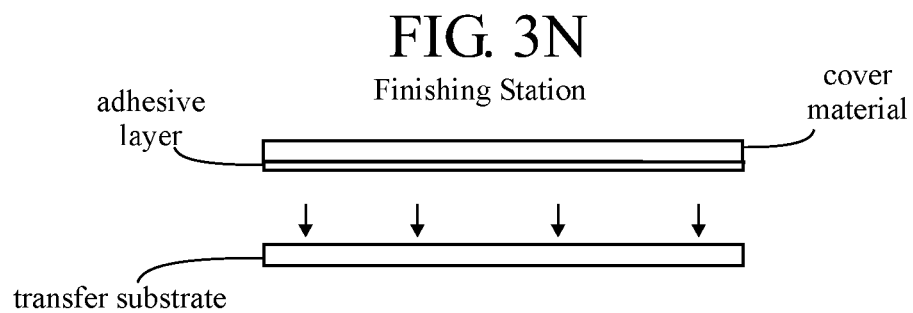

FIG. 3N is a cross-sectional view of a further step in a technique for applying adhesive to a layer of passport cover material, according to an embodiment of the invention.

Figure 4:
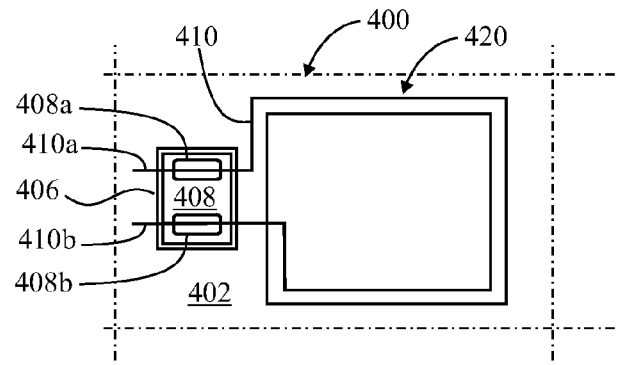

FIG. 4 is a diagram of a selected on of many transponder sites on an inlay substrate comprising an RFID chip (or chip module) disposed in a recess in the inlay substrate, and an antenna structure also disposed on the inlay substrate and connected by its termination ends (connection portions) to corresponding terminal areas (terminals) of the RFID chip module, illustrating an embodiment of the invention. FIG. 4 is illustrative of a "combination" of FIGS. 4A and 4B.

Figure 4A:
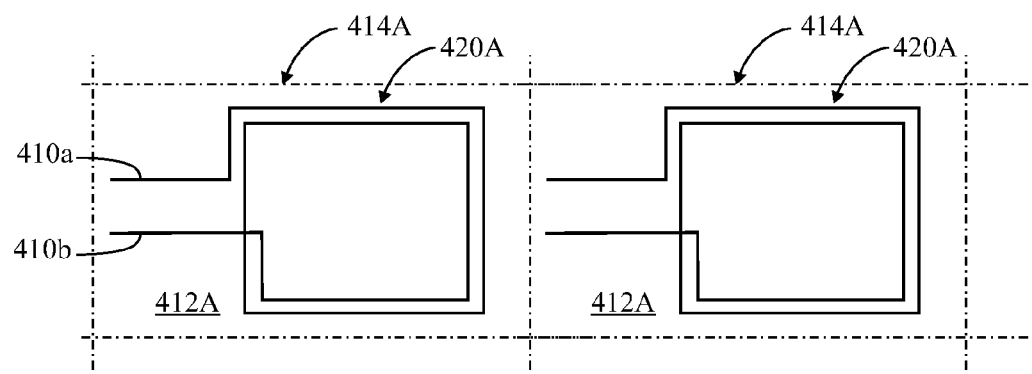

FIG. 4A is a diagram illustrating the formation and arrangement of antenna structures on an antenna substrate (such as film or carrier), according to an embodiment of the invention.

Figure 4B:
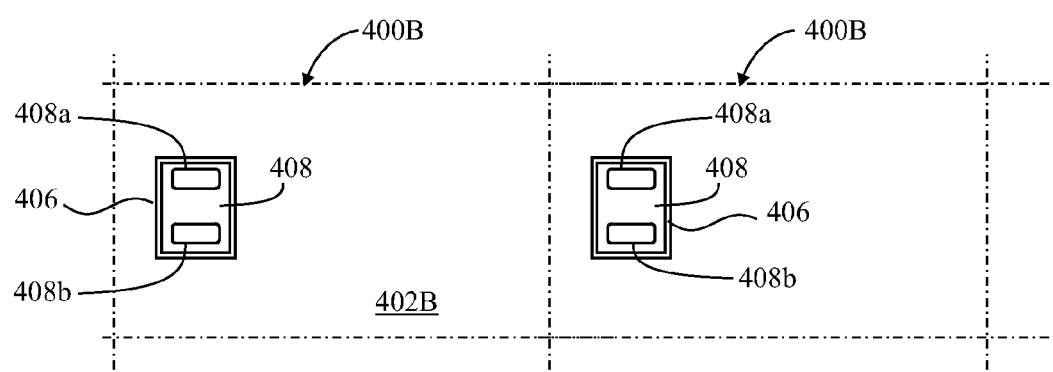

FIG. 4B is a diagram illustrating preparation transponder sites on an inlay substrate, for receiving the antenna structures of FIG. 4A, according to an embodiment of the invention.

Figure 4C:
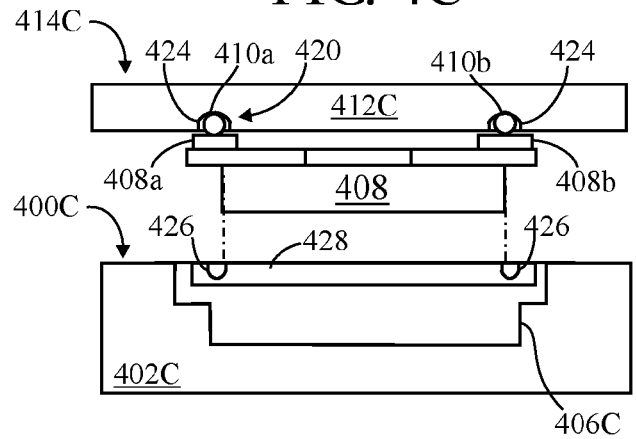

FIG. 4C is a diagram or cross-sectional view illustrating a technique for transferring an antenna structure from an antenna substrate to an inlay substrate, according to an embodiment of the invention.

Figure 5A:
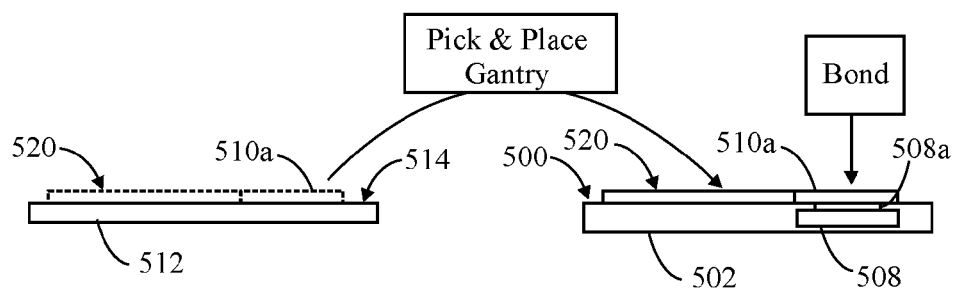

FIG. 5A is a diagram or cross-sectional view illustrating a technique for transferring an antenna structure from an antenna substrate to an inlay substrate, according to an embodiment of the invention.

Figure 5B:
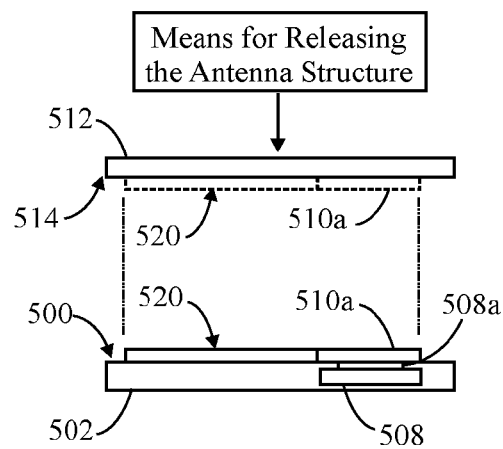

FIG. 5B is a diagram or cross-sectional view illustrating a technique for transferring an antenna structure from an antenna substrate to an inlay substrate, according to an embodiment of the invention.

Figure 5C:
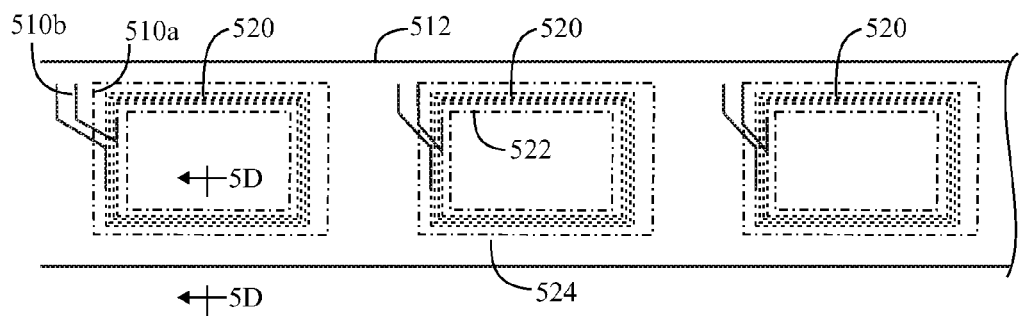

FIG. 5C is a diagram illustrating a technique for forming a plurality of antenna structures on an antenna substrate, prior to transferring the antenna structures from the antenna substrate to an inlay substrate, according to an embodiment of the invention.

Figure 5D:
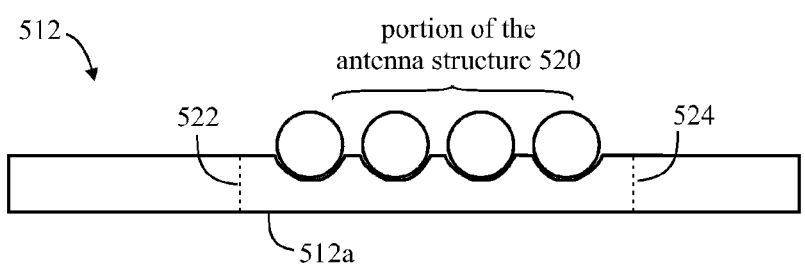

FIG. 5D is a diagram or cross-sectional view illustrating a further step in the technique for transferring antenna structures from an antenna substrate to an inlay substrate, according to an embodiment of the invention.

Figure 5E:
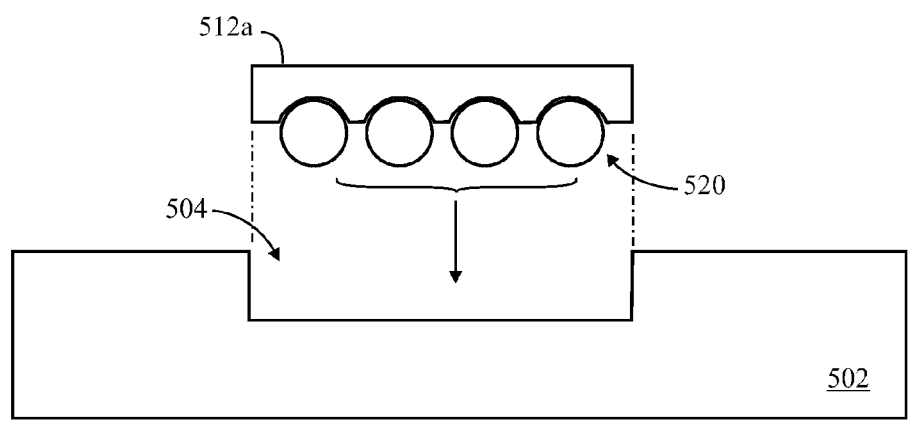

FIG. 5E is a diagram or cross-sectional view illustrating a further step in the technique for transferring antenna structures from an antenna substrate to an inlay substrate, according to an embodiment of the invention.

Figure 6A:
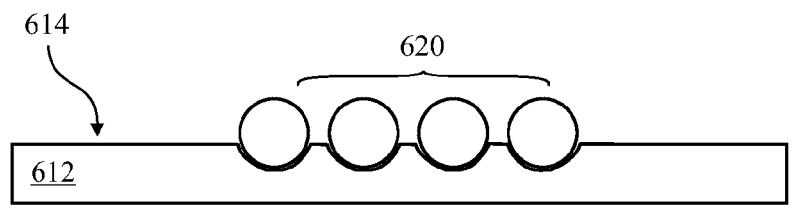

FIG. 6A is a diagram or cross-sectional view illustrating a technique for forming a plurality of antenna structures on an antenna substrate, prior to transferring the antenna structures from the antenna substrate to an inlay substrate, according to an embodiment of the invention.

Figure 6B:
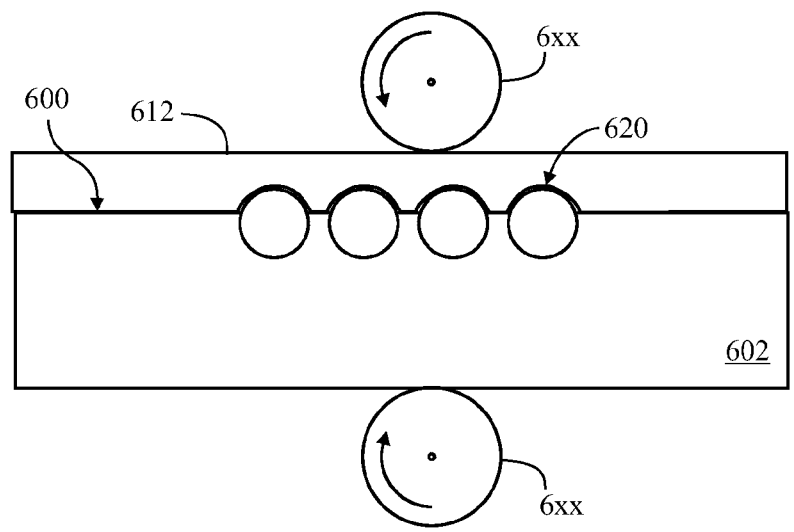

FIG. 6B is a diagram or cross-sectional view illustrating a further step in the technique for transferring antenna structures from an antenna substrate to an inlay substrate, according to an embodiment of the invention.

Figure 6C:
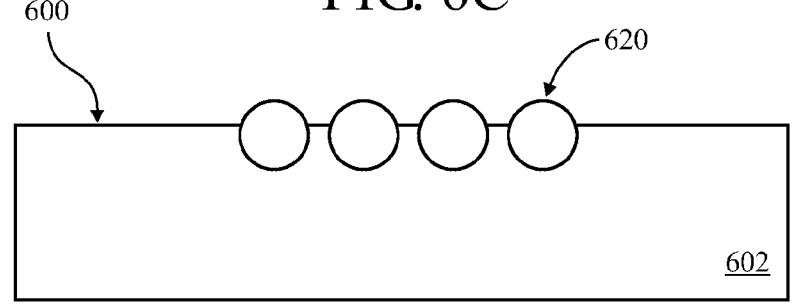

FIG. 6C is a diagram or cross-sectional view illustrating a further step in the technique for transferring antenna structures from an antenna substrate to an inlay substrate, according to an embodiment of the invention.

Figure 6D:
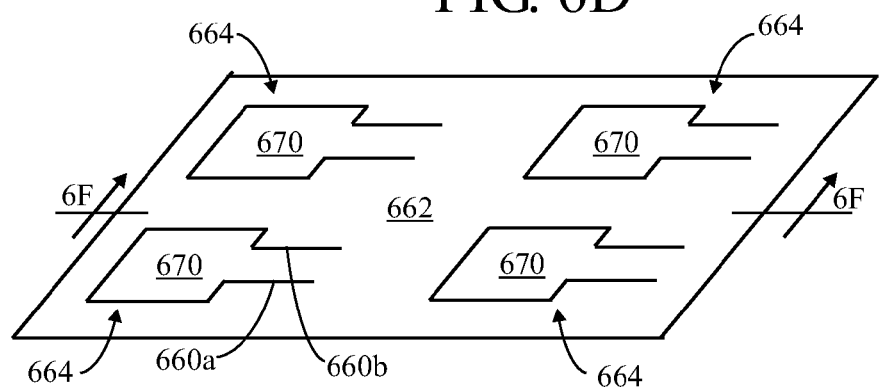

FIG. 6D is a diagram or perspective view illustrating a technique for forming a plurality of antenna structures on an antenna substrate, prior to transferring the antenna structures from the antenna substrate to an inlay substrate, according to an embodiment of the invention.

Figure 6E:
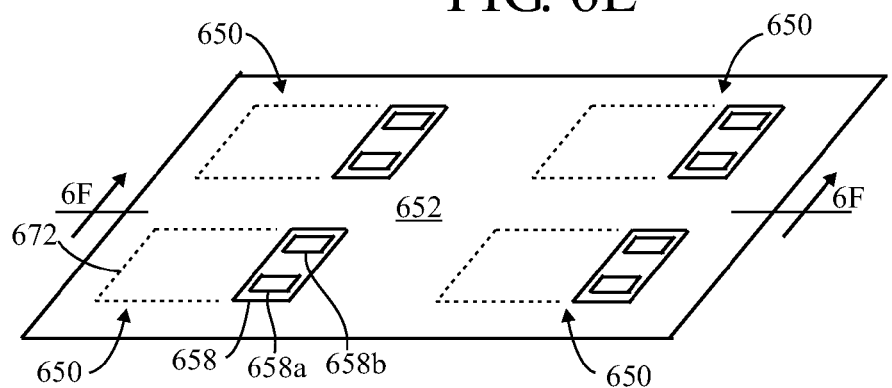

FIG. 6E is a diagram or perspective view illustrating a further step in the technique for transferring antenna structures from an antenna substrate to an inlay substrate, according to an embodiment of the invention.

Figure 6F:
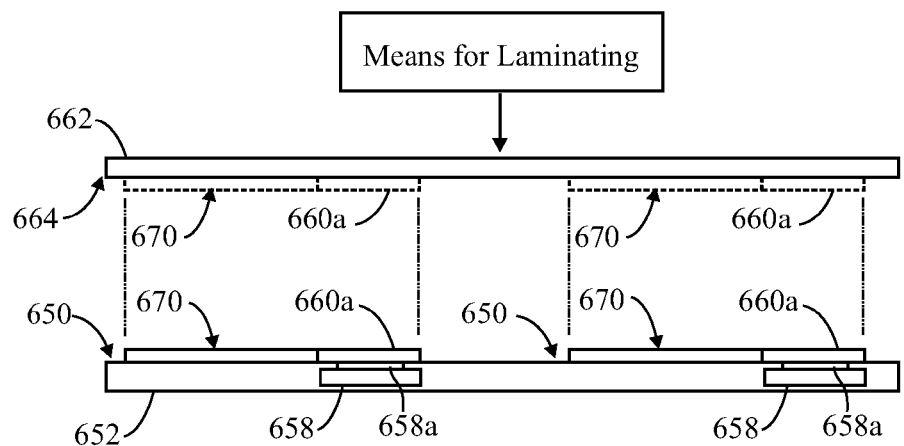

FIG. 6F is a diagram or cross-sectional view illustrating a further step in the technique for transferring antenna structures from an antenna substrate to an inlay substrate, according to an embodiment of the invention.

DETAILED DESCRIPTION

Various "embodiments" of the invention (or inventions) will be discussed. An embodiment is an example or implementation of one or more aspects of the invention(s). Although various features of the invention(s) may be described in the context of a single embodiment, the features may also be provided separately or in any suitable combination. Conversely, although the invention(s) may be described herein in the context of separate embodiments for clarity, the invention(s) may also be implemented in a single embodiment.

The relationship(s) between different elements in the figures may be referred to by how they appear and are placed in the drawings, such as "top", "bottom", "left", "right", "above", "below", and the like. It should be understood that the phraseology and terminology employed herein is not to be construed as limiting, and is for descriptive purposes only.

The invention relates generally to inlays and techniques for making the inlays, including technical features and security features. As used herein, an "inlay" may be a single- or multi-layer substrate containing HF (high frequency) and/or UHF (ultra-high frequency) radio frequency identification (RFID, transponder) chips and/or modules. These inlays may be used in secure documents, such as, but not limited to, electronic passports (ePassports) and electronic ID (eID) cards.

Some Embodiments of the Invention

Various embodiments of the invention will be presented to illustrate the teachings of the invention(s). In the main, examples of electronic passport covers with inlay substrates having leadframe modules may be used to illustrate the embodiments. It should be understood that various embodiments of the invention(s) may also be applicable to other secure documents containing electronics (such as RFID and antenna), such as electronic ID cards. Secure documents may also be referred to as "electronic documents". In the main hereinafter, secure documents which are passport inlays, typically cold laminated (with adhesive), are discussed.

The following embodiments and aspects thereof may be described and illustrated in conjunction with systems, tools and methods which are meant to be exemplary and illustrative, not limiting in scope. Specific configurations and details may be set forth in order to provide an understanding of the invention. However, it should be apparent to one skilled in the art that the invention(s) may be practiced without some of the specific details being presented herein. Furthermore, well-known features may be omitted or simplified in order not to obscure the descriptions of the invention(s).

Forming Recesses in a Substrate

A method of forming a recess in an inlay substrate for a transponder chip module may comprise: forming a recess for the RFID transponder chip (or chip module) in a surface of an inlay substrate, wherein the recess extends at least partially through the inlay substrate. A laser may be used to form the recess by ablating material from the substrate. The laser may be scanned across the surface of the substrate to form the recess. The substrate may comprise Teslin™.

FIG. 2A illustrates an exemplary process 200 of forming a recess (opening, window) 206 in an inlay substrate 202, using a laser. The inlay substrate 202 may be a single layer of Teslin™ (for example), having a thickness "t" of 356 μm. A typical size (width dimensions) for the recess 206, to accommodate a chip module with a lead frame, may be approximately 5 mm×8 mm. The recess may extend completely through the inlay substrate, resulting in a "window-type" recess. The recess may extend only partially, such as 260 µm through the inlay substrate, resulting in a "pocket-type" recess (FIG. 1B illustrates a pocket-type recess).

The Laser emits a beam (dashed line), targeted at the substrate, to ablate material from the substrate to form the recess. The beam may have a diameter of approximately 15 to 60 µm. The beam may be scanned back and forth, traversing in one direction entirely across the recess area, turning around, and traversing back across the recess area, like plowing a field. Many passes may be required to carve out the entire area and depth of the recess, given that the beam diameter is typically much (such as 10-100 times) smaller than the length or width of the recess. As is known, the beam may be scanned, in any suitable manner, such as with scanning minors. Also, the intensity of the beam may be controlled or modulated to control the penetration into the substrate. For example, a pulse-width modulated beam may be used. The Laser may be a UV laser (355 nm) with a power ranging from 15 to 50 watts.

The process of using a laser in this manner, rather than (for example) a conventional rotating milling tool, may be referred to as "laser milling". The technique described herein may be particularly beneficial for applications where it is desired to form a "pocket" type recess which intentionally does not extend all the way through the substrate or sheet (in other words, the recess or pocket extends only partially through the substrate). Mechanical milling can be difficult. On the other hand, laser milling can be very effective for Teslin™ and polycarbonate (PC) substrates. For PVC, laser milling is less effective.

The recess (opening) 206 formed in the inlay substrate 202 of FIG. 2A is shown extending completely through the inlay substrate 202, but may extend only partially through the substrate. The recess may have straight sidewalls, or it may be "stepped".

A chip module (such as 108) may be disposed in the recess so as to be substantially contained within the inlay substrate (as illustrated in FIG. 1B), without protruding from the surface there of, and without creating a "bump" in an overlying layer, such as the cover layer or overlay layer.

FIG. 2B shows forming a stepped pocket-type recess 206b in a single layer of material, such as a layer of Teslin™ for an inlay substrate 202b, using laser ablation. This may be a two-step process comprising:
first laser milling a central area (such as between "b" and "c") to a depth ("d2" minus "d1") partially through the substrate,
then continuing laser milling the entire area (such as between "a" and "d") to create a recess extending to a depth "d1" partially through the substrate in a peripheral area, and extending in the central area to a depth "d2" deeper into (but not completely through) the substrate.
Alternatively:
first laser milling the entire area (between "a" and "d") to a first depth ("d1")
then laser milling only the central area (between "b" and "c") to a second depth ("d2").

Forming Channels in a Substrate

The antenna wire may be mounted to the surface of an inlay substrate by ultrasonically embedding (countersinking) it into the surface of the inlay substrate. Ideally, the antenna wire would be fully embedded so that it is flush or below the top surface of the inlay substrate. For applications such as driver's license or passports, it is generally not desirable that the wire be less than fully embedded and extend (protrude) above the surface of the inlay substrate. Rather, it is desirable that the antenna not be visible (known as "witnessing the wire") to the user in the end product.

With ultrasonic embedding, the wire may become only partially embedded, such as approximately half its diameter. In Teslin™, it is very difficult to ultrasonically embed an antenna wire. Self-bonding wire may be used, and after mounting the wire on the substrate (and forming the turns of the antenna) it may be pressed into the substrate, using heat and/or pressure, through a lamination process In order to facilitate fully embedding the wire, a "channel" (or "groove", or "trench") may be formed in the surface of the inlay substrate to accept the antenna wire. Then, the antenna wire may then be laid (inlaid, pressed, sunk) into the channel.

The depth of the channel should be at least a substantial portion of the diameter of the wire. Alternatively, the channel may be less deep than the diameter of the wire and, as the wire is laid down into the groove, it may be pressed further into the substrate.

The width of the channel may be approximately equal to the diameter of the wire. Or, the channel may be narrower than the diameter of the wire, such as approximately 95% of the diameter of the wire, to facilitate an "interference" fit, securely holding the wire in position for subsequent handling.

Generally, the wire typically has a circular cross-section (but may have other cross-sections, such as a ribbon wire), and the groove may have a substantially rectangular cross-section. The wire may be self-bonding wire having an adhesive coating.

By first forming channels to accept the wire in the substrate, several advantages may be realized, such as eliminating the need for the pressing operation associated with ultrasonic embedding of the antenna wire.

FIG. 2C illustrates a technique 220 using a laser to form a channel (groove, trench) 222 in a surface of an inlay substrate 202. This is an example of removing material to form the channel. The laser is shown moving from left-to-right in the figure.

A wire 210 is shown being laid down (installed) into the channel 222, from left-to-right, and may be urged into the channel by a simple pressing tool (or wheel) 224. The wire 210 may be laid into the channel during formation of the channel, by following after (to the left of) the laser a distance "u". The wire may be installed after the channel is completed.

The wire 210 may be a self-bonding (coated, self-adhering wire). In conjunction (such as simultaneous) with laying the wire in the groove (channel), the wire may be warmed thermally (such as with heat), chemically activated (such as with alcohol), or warmed electrically (such as by passing a current through the wire. The pressing tool 224 itself may be heated. Or, a separate heating element 226 may be provided, such as a nozzle directing hot air onto the wire either immediately before (to the right of) or after (to the left of, as shown) the pressing tool 224. The heating element 226 may be a laser operating in a range to heat the wire sufficiently to activate the adhesive coating.

Although only one straight channel is shown, a 2-dimensional (x-y) groove pattern may thus be formed in (extending into) the top surface of the inlay substrate, for accepting an antenna wire having a number of turns or coils. A single channel (portions of an overall channel) may extend from adjacent the chip module (such as from an edge of the recess receiving the chip module), across the surface of the substrate to define a pattern for the turns of the antenna, returning to adjacent the chip module (such as to an opposite edge of the recess receiving the chip module).

FIG. 2D illustrates a method of forming a pattern of channels (or portions of an overall channel) in a substrate 202 to accommodate an antenna wire in a situation where the wire needs to cross over itself (such as shown in FIG. 1A), in which case insulated wire may be appropriate. (FIG. 4 of U.S. Pat. No. 6,088,230 and FIG. 5 of U.S. Pat. No. 6,233,818 show an antenna pattern with crossovers. Typically, a short circuit may be avoided at the crossover by using insulated wire, and the sonotrode may be switched off in the vicinity of the crossover).

The use of channels for accepting the antenna wire can be advantageous for mounting an antenna wire in a pattern that requires the antenna wire to cross over itself, without shorting. (The use of insulated wire may avoid short-circuiting, but channels may still be desirable for other reasons, including that a sonotrode is generally not necessary for laying the antenna wire in the channel.) For example:

a first portion of the antenna wire may be "fully" embedded in a channel, without protruding above the surface of the substrate. The channel may be made deeper than the wire at the point where crossover will occur to ensure that the antenna wire is indeed fully embedded.

Then, a second portion of the antenna wire which crosses over the first portion may be laid on the surface of the substrate.

Alternatively, a first portion of the antenna wire is fully embedded in a first channel (or portion of the overall channel) which is very deep where the second portion of the antenna wire will be crossing over the first portion of the antenna wire. (The first, deep portion of the channel may be approximately twice as deep as the second, shallow portion of the channel.)

the second portion of the antenna wire is embedded in a channel (or portion of the overall channel) which is "normal" depth for accepting a wire conductor The depth of the first channel portion is sufficient that the second portion of the wire crossing over the first portion of the antenna wire does not short thereto.

FIG. 2D illustrates the latter variation where there is a shallow channel portion 222a crossing over a deep channel portion 222b. The channels 222a and 222b may be portions of a single overall channel in the substrate 202 defining the antenna pattern. A second portion 210b of the antenna wire crosses over the first portion 210a of the antenna wire.

A first portion 210a of the antenna wire 210 is disposed in the deep portion 222b of the channel, and is shown in dashed lines. A second portion 210b of the antenna wire is disposed in the shallow portion 222a of the channel. In this manner, the second portion of the antenna wire may pass over the first portion of the antenna wire without contacting it. Some exemplary dimensions are:

the wire may have a diameter of 80 µm
the channel(s) may have a width of 100 µm
the shallow channel may have a depth of 100 µm
the deep channel may have a depth of 200 µm
the substrate may have a thickness of 350 µm Generally, insulated and/or self-sticking (self-bonding) wire would be used. But using these techniques, un-insulated (bare) wire may also be used, again avoiding the necessity of removing insulation from connection portions of the wire.

Once the channel is created, the wire conductor (which may be a self-bonding wire) can be installed into the channel and simultaneously thermally or chemically activated (with laser, hot air, with alcohol), so that the adhesive layer of the self-bonding wire sticks to the walls of the channel.

If the diameter of the laser beam is sufficiently wide (corresponding with the desired width of the channel), and has sufficient fluence (to penetrate to the desired depth of the channel), the channel may be formed with one pass of the laser. To enhance the quality (such as texture) of the structure of the channel, it may be advantageous to use an ultrafast laser (in the picosecond or femtosecond range) using a low fluence above the threshold fluence and removing material layer by layer (several passes). At high fluence, there is a trade-off in rate of material removal and the quality of etching.

Multiple passes of the laser may be scanned across the length of the channel to increase the width and/or depth of the channel, each pass of the laser ablating the channel to an increased depth, in an iterative manner. For example, several passes of the laser may be used to form a channel having an overall depth of 80 µm by ablating a 30 µm wide, 5-10 µm deep amount of material with each pass. For example, to form a channel having a width of approximately 100 µm (such as 97 µm) and an overall depth of 80 µm, multiple passes of a laser having a beam width of 30 µm may be used. In one pass, the 30 µm diameter beam may ablate approximately a 70 µm wide area, to an average depth of approximately 5 µm. In subsequent passes, the beam may be overlapped with a previously ablated area, such as with a 50% overlap. In three or four passes, the 100 µm wide channel may be ablated.

Generally, the laser beam may be directed to the surface of a substrate via a galvanometer. The laser beam ablates the material line for line with an overlap of about 50-60% to get the best surface finish.

The width of the laser beam (hence, the resulting width of ablation) may be modified optically (beam shaping—such as with lenses, using a mask or changing the beam shape) to have a narrower laser beam width. The penetration of the laser beam (hence, the resulting depth of ablation) may be modified by changing the fluence and or repetition rate of the laser.

The channel may be formed with many (several) passes of the laser, each pass forming a portion of the overall channel. For example, a first pass of the laser may form a first portion of the channel having a width of approximately 100 µm (such as 97 µm) and a depth of 5 µm (dependent on the laser pulse energy and repetition rate). A second and several subsequent aligned passes of the laser may extend the previously formed portion(s) of the channel deeper, maintaining the same 97 µm width, until an intermediate channel depth of 45 or 50 µm is achieved—half of the desired overall depth of the channel. Then, maintaining alignment, in subsequent several passes the width of the laser beam may be lessened with each pass, resulting in a bottom portion (half) of the channel tapering down. In this manner, a channel can be created which has a profile (cross-section) similar to that of the wire. This may increase the opportunity for the antenna wire to stick to the walls of the channel.

FIG. 2E illustrates a method of forming a channel in a substrate with multiple passes of the laser, the resulting channel having a tapered profile. A first path "P1" is shown over a central portion of the channel. A second path "P2" is shown over a left portion of the channel. A third path "P3" is shown over a right portion of the channel. The order of these paths can be different.

Notice that the channel in the figure is "stepped". This represents making several passes with the laser, at a few (such as three) widthwise positions (paths P1,P2,P3). Each pass of the laser may only remove 5 µm of material, in which case 20 passes would be needed to achieve a depth of 100 µm at any given position.

The channel can be rectangular (straight sidewalls). The channel can be tapered, or U-shaped. In FIG. 2E, the top half (such as upper 50 µm) of the channel has straight sidewalls, and the lower half (such as bottom 50 µm) of the channel decreases in width as the depth increases, thereby the sidewalls are tapered, and approximate the semicircular profile of the bottom half of the antenna wire (shown in dashed lines). This increases the contact area between the sidewalls of the channel and the antenna wire, which will enhance adhesion of a self-bonding wire in the channel.

Alternatively, masks may be used to block portions of the laser beam and effect a similar stepwise decrease in width accompanying increase in depth.

Some exemplary operating conditions for the laser may be:
   operating the laser at a pulse repetition rate of 30-40 kHz (one pulse every approximately 30 microseconds)
   the duration of each pulse may be approximately less than 10 picoseconds A low duty cycle (relatively short pulse in a relatively long interval) may be advantageous for "cold ablation", where the material is not significantly heated.

The polymer substrate may be porous, facilitating the laser ablation, and the ablation may be performed in an inert atmosphere. Debris can be removed through a suction system (not shown).

FIG. 2F illustrates that channels for receiving an antenna wire may extend from edges, such as opposite side edges of a recess for receiving a chip module.

Forming Channels in an Adhesive Layer

FIGS. 2G and 2H illustrate that a channel 272 forming an antenna pattern may be formed in a layer 274 of adhesive on the surface of an inlay substrate 276 (or a layer of a multi-layer inlay substrate), and a wire 278 may be mounted therein using a tool 280. For example, the adhesive 274 may be 80 µm thick glue. The channel (groove, trench) 272 may be, for example, 60-80 µm deep. The channel 272 may go all the way through the adhesive 274, and further into the substrate. The channel 272 may extend only partially through the adhesive 274, as indicated by the dashed line at the bottom of the channel 272.

The adhesive 274 may be polyurethane. Polyurethane, once beyond its "open time", goes hard, making it ideal for channel (groove, trench) formation. Later, for laminating, it may be reactivated with a heat source, such as an infrared light. Hence, the adhesive may be applied sufficiently in advance of channel formation, such as 1-10 minutes (for example) before, to facilitate channel formation.

Filling Channels in a Substrate

FIG. 2I illustrates a substrate 276 having a channel (groove, trench) 262 formed in a top surface thereof, and a quantity of flowable, conductive material 244 applied on the surface. Some of the material 244 may be in the channel 262. The conductive material 244 may be viscous, such as metallic powder, conductive glue (see list above). A squeegee 246 is shown positioned above the material 244. The squeegee 246 will be lowered (see arrow) so as to be substantially in contact with the top surface of the substrate 276.

FIG. 2J illustrates that as the squeegee 246 is advanced (see arrow), it forces the conductive material 244 into the channel 262. Residual conductive material 244 is substantially cleared from the surface of the substrate 208, but an additional cleaning step may be added.

Filling Channels in an Adhesive Layer

FIGS. 2K and 2L are similar to FIGS. 2I and 2J, and show that the channels can be formed in a layer 280 of adhesive on the surface of the substrate 276 and filled with conductive material 244. In this example, the adhesive 280 is 80 µm thick glue. The channel (groove, trench) 262 may be, for example, 60-80 µm deep. The channel 262 may go all the way through the adhesive 280, and further into the substrate 276.

The adhesive 280 may be polyurethane. Polyurethane, once beyond its "open time", goes hard, making it ideal for trench formation. Later, for laminating, it may be reactivated with a heat source, such as an infrared light. Hence, the adhesive may be applied sufficiently in advance of channel formation, such as 1-10 minutes (for example) before, to facilitate channel formation.

Adhesive Coating of an Electronic Passport Cover

This embodiment relates to inlay substrates adhesively attached to passport cover material to produce an intermediate product used in the production of security documents such as electronic passports.

A "security document" such as an electronic passport (ePassport) may comprise an "inlay substrate" (or "inlay laminate") which is typically a sheet (or layer) of material such as Teslin™, with a Radio Frequency Identification (RFID) chip module and corresponding antenna mounted therein, with an additional "cover layer" (or "cover material"), such as PVC-coated paper, cloth or synthetic leather laminated (or joined) thereto. The production of an electronic passport cover involves the adhesive attachment of an inlay substrate with a cover layer.

The inlay format is typically "3up" (for making three passport covers on a single sheet of inlay material), and is generally planar and rectangular, having exemplary overall dimensions of 404.81 mm×182.56 mm×0.70 mm (thick).

The material for the cover layer may be PVC coated offset board or acrylic coated cotton, embossed and thermo-resistant. In the case of the fabric material, the backside coating can be water-base coated (aqueous/non-solvent), synthetic coated or have no coating. The front side coating can have two base coatings and one top coating of acrylic. An alternative to acrylic coating is peroxylene-based coating (nitrocellulose). The fabric can have a strong bias (diagonal) in the weave (drill weave as opposed to linear weave) which gives it high tensile strength and restricts the elongation. The leather embossing grain can have the resemblance of the skin of a kid goat or sheep (skiver) and is applied using an embossing cylinder drum at a pressure of 60 tons at around 180 degrees Celsius (° C.). Because of the front and backside coatings the fabric is not porous.

The material for the cover layer may be a cloth product, with chemistry in the coatings and a leather-like appearance to the cloth, such as by Holliston Inc. (905 Holliston Mills Road, Church Hill, Tenn. 37642; www.holliston.com)

The material for the inlay substrate may be Teslin™, a waterproof synthetic film, single-layer, uncoated with a thickness of 356 microns.

Typically, the cover material is supplied in web form and coated with an adhesive with a short opening time, before laminating with an inlay layer. Such web coating and lamination systems are supplied by Nordson.

However, because of the nature of the fabric material and the supplier's manufacturing process, they are many defects such as blemishes, scratches, cross directional lines, untextured surface, bent edges and dents in the cover layer when supplied in web form. The sorting of these defects is best done by the supplier of the cover layer, but this limits the format of the deliverable cover layer to sheets.

An overall view of a passport cover is shown in FIG. 1G which shows a cover layer laminated to an inlay substrate (the chip module and antenna structure are omitted from the view, for illustrative clarity, having been shown elsewhere).

According to an embodiment of the invention, a method is described for converting individual sheets of cover material and into an endless web to be coated with an adhesive and then cutting the coated material into sheets for lamination with inlay substrates to produce electronic passport covers.

In one embodiment of the invention, the sheets of cover material are overlapped at each end by approximately 1 cm. The overlapping sheets at each end are bonded together, punctually (at distinct points) or continuously, using a hot stamp or an ultrasonic tool. The cover material bonds easy because of the acrylic coating.

FIG. 3A shows two (of several) individual cover sheets being joined end-to-end, as follows:
- a first Holliston fabric sheet 302 having a right (as viewed) end
- a second Holliston fabric sheet 304 having a left (as viewed) end
- the right end of the sheet 302 overlaps the left end of the sheet 304 by approximately 1 cm (the right end portion of the sheet 302 is atop the left end portion of the sheet 304)
- an ultrasonic tool 310 may be used to bond ("weld") the top sheet 302 to the bottom sheet 304 in an "overlap area" (right end portion of left sheet 302 overlapping left end portion of right sheet 304).
- The "weld" points may be approximately 2 cm apart from one another (alternatively, the weld may be continuous, not punctual)
- the sheets 302 and 304 are being fed and conveyed from left to right (as viewed)
- a roller 320 is used for applying adhesive (not shown) to the top surface of the joined sheets
- another roller 322 is disposed under the joined sheets, opposite the roller 320, to support the sheets during adhesive application.
- additional rollers and/or a conveyor belt may be incorporated, as illustrated
- A given Holliston fabric sheet (302 or 304) may be 360 μm thick including an acrylic coating of a few microns on its top (as viewed) surface.
- The sheets 302, 304 may each measure 300 mm long (left to right), and 200 mm wide.
- The sheets (302, 304) may be another synthetic material such as Teslin™
- Many sheets may be joined in this manner to make a web (roll). For example, 100 sheets each 30 cm long to form a continuous web 30 m long.
- In use (e.g., joining to an inlay substrate), the overlap area may be excised (not used in the final product).

Joining Sheets of Material Together

FIG. 3B shows a chip module 308 installed in a recess 306 of an inlay substrate 302. A side extension, or edge region 304 of the substrate 302 may be thinned by laser ablation such as to a fraction of the substrate's original thickness, such as to approximately 50% of the original thickness. A laser is shown ablating from the top (as viewed) surface of the substrate, but it will be understood that the ablating could occur from the bottom surface of the substrate 302, or from both the top and bottom surfaces of the substrate 302. By thinning the substrate at an edge region, an "overlap joint" may be made with another element, such as a flap of plastic material 330 (shown in dashed lines).

FIG. 3C shows that laser ablation may be used to create "studs" 332 along the edge region 304 of the substrate 302 for inserting into holes of a separate element (not shown, such as a plastic flap).

FIG. 3D shows that laser ablation may be used to create holes 334 along the edge region 304 of the substrate 302 for receiving mating studs of a separate element (not shown, such as a plastic flap).

The technique shown in FIGS. 3B,C,D may be useful in a method for manufacturing a booklet, such as for instance an ID booklet, which booklet is provided with a number of sheets of paper and a cover material, each sheet having a front and a reverse side, each side comprising two pages, which method comprises connecting the sheets of paper to each other along a line between the pages, attaching the cover material to the outside of the booklet, and making a fold in the sheets of paper to form a back of the booklet, such as is disclosed in U.S. Pat. No. 6,213,702, incorporated by reference herein.

Generally, laser ablation may be used to thin an entire region of the substrate, and to form 3-dimensional features such as studs in a thinned region of the substrate, or to form holes in a thinned region of the substrate. Each of these would constitute a "mechanical feature" of an inlay substrate which may be used to create an interlocking clamp between a flap and a data page inlay using laser ablated studs and recesses.

Wide Channels (Trenches) for Accepting an Antenna Structure

As described hereinabove, channels may be formed for accepting an antenna wire. According to an embodiment of the invention, a wide "antenna trench" (channel, trench, groove) may be formed in the inlay substrate, the trench having a width which is sufficient to accept the several (4 or 5) turns of an the antenna structure. The antenna structure may be formed "off line" (other than on the inlay substrate, such as by radial coil winding, winding a coil according to the flyer principle, scribing or placing a wire on an intermediate medium and forming a coil to be transferred, forming a coil on a spindle (mandrel), punching a metallic foil to form parts of a coil etc.), and then is placed into the wide antenna trench. After installing the antenna structure in the wide antenna trench, connection portions (ends or end portions) of the antenna wire may be connected to the terminals (terminal areas) of the chip module. The wide antenna trench may be formed using laser ablation, and may extend from edges of a recess (which also may be formed by laser ablation) for the chip module.

This technique bears some resemblance to U.S. Pat. No. 5,809,633 (Mundigl), but because there is a wide trench, it is not necessary to press the antenna into the substrate.

FIG. 3E shows four individual portions 310a, 310b, 310c, 310d of an antenna wire (310) being inserted into corresponding four individual portions 312a, 312b, 312c, 312d of a channel (312) or channels in a substrate 302. The substrate 302 may be an inlay substrate for a transponder. Each portion of the wire may be inserted (laid) sequentially (turn-by-turn) into the corresponding channel portion as the turns of the antenna are formed on the substrate, such as using a sonotrode tool (such as in the manner that a sonotrode tool is used in U.S. Pat. No. 6,233,818 to lay an antenna wire on an inlay substrate). The channel may be formed by laser ablation.

FIG. 3F shows a single, wide antenna trench (or groove) 422 formed in a substrate 402. The substrate 402 may be an inlay substrate for a transponder. The antenna trench 422 may be several times wider than the diameter (or cross-dimension) of the wire (the wire need not have a round cross-section), so that the single wide antenna trench can accommodate the multiple turns of an antenna structure. The trench (which is essentially a wide channel) may be formed by laser ablation.

An antenna structure (320) having four turns 320a,b,c,d of antenna wire (a flat coil) is shown being disposed (installed into) the wide antenna trench 322. Typically, the turns of the antenna structure would be spaced slightly apart from one another (rather than touching).

The antenna trench may have a width (across the page) which is much wider than the cross-dimension (diameter) of the antenna wire. For four turns of antenna wire, the antenna trench should be at least 4 times wider than the diameter of a given wire (more like 5 times as wide allowing for some spacing between adjacent turns of the wire).

The antenna trench 322 may be "much wider", such as at least 2 times wider than the cross-dimension (diameter) of the antenna wire (or the like) so that it can accommodate at least two turns of a flat antenna coil structure disposed in the antenna trench. For example, four turns of 80 µm wire, spaced 40 µm apart from one another, in a 450 µm wide antenna trench 322.

The wide antenna trench should have a depth (into the substrate, from a front surface thereof) which is approximately equal to the diameter of the wire so that the flat coil of the antenna structure will be recessed at least flush within the trench, not protruding above the front surface of the substrate after it is installed.

The turns of the antenna structure may be laid (scribed) into the trench sequentially (turn-by-turn) using a sonotrode tool (such as in the manner that a sonotrode tool is used in U.S. Pat. No. 6,233,818 to lay an antenna wire on an inlay substrate). Alternatively, the antenna structure can be preformed, and disposed as a single unit into the wide trench. In conjunction with laying the antenna in the trench (whether turn-by-turn or as a single unit), connection portions (ends, end portions) of the antenna being formed in the trench may be connected to terminals of the chip module.

Connection portions (ends, end portions) of a preformed antenna structure wire may be connected to terminals of the chip module (not shown) prior to installing the antenna in the trench (in such a case, the antenna and chip module would be installed together, as in U.S. Pat. No. 5,809,633 Mundigl), or the antenna wire may be connected to the terminals of a chip module previously installed in the substrate.

Glue may be dispensed in the antenna trench the width of an antenna, and wire embed or place an antenna into the antenna trench.

The trench to accept an antenna structure may be partially filled with adhesive. Alternatively, a layer of adhesive could be disposed over the entire area of the inlay substrate covering the trench for the antenna structure and the recess for the chip module. In placing the chip or chip module in its laser ablated recess, the adhesive would act as an anti-fretting medium to reduce the risk of micro-cracking especially in polycarbonate (PC) cards.

As an alternative to using wire, copper foil(s), such as punched (stamped) metallic foils may be laid into the antenna trench. A ribbon may be used.

A process involving the selective deposition and formation of copper layers is described at http://www.kinegram.com/kinegram/com/home.nsf/contentview/~kinegram-rfid FIG. 3G shows that a wide antenna trench may be contiguous with (extend from the edges of) a recess for the chip module, in a manner similar to that shown (for a single wire channel) in FIG. 2F. However, the trench need not be wide where it meets the recess, since typically only one width of the wire will be coming onto the chip module (such as one end of the antenna wire one on each of two opposite sides of the chip module), such as is illustrated in FIG. 1A. The trench may be wide where it needs to be, and narrower where appropriate, the width of the trench at a given location depending on what is going to be inserted into the trench, which may be an irregularly shaped object, such as an antenna structure having a main body portion (the turns) and termination ends extending from the main body portion (see for example FIG. 4).

The antenna wire may be insulated and/or self-binding. If using insulated wire, the insulation (and self-bonding) layers may be removed, such as by using an excimer laser (UV), at the positions for interconnection (end portions, or connection portions of the antenna wire). For an antenna having an overall length of 114 cm, insulation may be removed every 114 cm. To avoid oxidization, the bare (copper) portions of the wire may be coated with a very thin layer of insulation which may evaporate at low temperature during thermo compression bonding.

The two connection portions (terminal ends, ends, end portions, or the like) of the antenna may be connected to opposing sides of the RFID chip, so as to reduce the abrasion of the antenna wire between the leadframe and the substrate. Conventionally, each wire end of the antenna is embedded into the substrate on each side of the terminal area (one side of the leadframe) creating tension of the wire end at the interface between the leadframe and the substrate, resulting in the gradual cutting of the wire end at the positions of the leadframe.

Adhesive Coating Using a Transfer Substrate

This embodiment relates to inlay substrates adhesively attached to passport cover material to produce an intermediate product used in the production of security documents such as electronic passports. In particular, the invention describes a technique (process) for smooth adhesive coating of and having a smooth adhesive finish on the electronic passport cover material, especially in the hinge area, to facilitate the adhesive attachment of the passport booklet to the inlay cover.

A "security document" such as an electronic passport (ePassport) may comprise an "inlay substrate" (or "inlay laminate") which is typically a sheet (or layer) of material such as Teslin™, with a Radio Frequency Identification (RFID) chip module and corresponding antenna mounted therein, with an additional "cover layer" (or "cover material"), such as PVC-coated paper, cloth or synthetic leather laminated (or joined) thereto. The production of an electronic passport cover involves the adhesive attachment of an inlay substrate with a cover layer.

The inlay format is typically "3up" (for making three passport covers at once), and is generally planar and rectangular, having exemplary overall dimensions of 404.81 mm×182.56 mm×0.70 mm (thick).

The material for the cover layer may be PVC coated offset board or acrylic coated cotton, embossed and thermo-resistant. In the case of the fabric material, the backside coating can be water-base coated (aqueous/non-solvent), synthetic coated or have no coating. The front side coating can have two base coatings and one top coating of acrylic. An alternative to acrylic coating is peroxylene-based coating (nitrocellulose). The fabric can have a strong bias (diagonal) in the weave (drill weave as opposed to linear weave) which gives it high tensile strength and restricts the elongation. The leather embossing grain can have the resemblance of the skin of a kid goat or sheep (skiver) and is applied using an embossing cylinder drum at a pressure of 60 tons at around 180 degrees Celsius (° C.). Because of the front and backside coatings the fabric is not porous.

The material for the cover layer may be a cloth product, with chemistry in the coatings and a leather-like appearance to the cloth, such as by Holliston Inc. (905 Holliston Mills Road, Church Hill, Tenn. 37642; www.holliston.com)

The material for the inlay substrate may be Teslin™, a waterproof synthetic film, single-layer, uncoated with a thickness of 356 microns.

Typically, the cover material is supplied in web form and coated with an adhesive with a short opening time, before laminating with an inlay layer. Such web coating machines are supplied by Nordson (http://www.nordson.com) which operate on the principle of a slot nozzle system to apply the adhesive layer to the cover material.

A number of disadvantages are evident when processing cover material in web form. Because of the nature of the fabric material and the supplier's manufacturing process, they are many defects such as blemishes, scratches, cross directional lines, un-textured surface, bent edges and dents in the cover layer when supplied in web form. The sorting of these defects is best done by the supplier of the cover layer, but this limits the format of the deliverable cover layer to sheets.

However, in processing sheets, it is necessary to use a roller coater instead of a slot nozzle system which is generally used in processing web material. The roller coater basically applies the adhesive to the cover material via a rotating roller.

A disadvantage of the roller coater is that an impression is left on the adhesive layer from the roller, leaving a rough surface texture. This may be particularly troublesome at the hinge area of an electronic cover inlay, having an uneven surface to attach the passport booklet to the inlay cover.

The production of an electronic passport cover (such as shown FIG. 1G) in may involve the adhesive attachment of an inlay substrate with a cover layer.

FIG. 3H is a simplified cross-sectional view of a passport cover having a cover laminated to an inlay substrate, and showing a hinge gap. A front panel is on one side of the gap, a back panel is on the other side of the gap. A chip module (CM) and antenna may be disposed in either one of the front or back panels of the inlay substrate.

FIG. 3I is a plan view illustrating an "inlay", (or "passport inlay", or "e-cover inlay") for preparing three (3) "passport covers" (such as shown in FIG. 1G). The cover layer 304 is shown partially, so as to reveal the underlying inlay substrate 302. FIG. 3J is a cross-sectional view through FIG. 3I.

An e-cover inlay 300 having a "front" portion and a "back" portion, and may comprise (compare FIG. 1H, but without a bottom layer):

a cover layer (cover material) 304, such as approximately 350 µm thick; and an inlay substrate 302, such as approximately 356 µm thick (14 mils) Teslin™

The material for the cover layer 304 may be PVC coated offset board or acrylic coated cotton, embossed and thermo-resistant. In the case of the fabric material, the backside coating can be water-base coated (aqueous/non-solvent), synthetic coated or have no coating. The front side coating can have two base coatings and one top coating of acrylic. An alternative to acrylic coating is peroxylene-based coating (nitrocellulose). The fabric can have a strong bias (diagonal) in the weave (drill weave as opposed to linear weave) which gives it high tensile strength and restricts the elongation. The leather embossing grain can have the resemblance of the skin of a kid goat or sheep (skiver) and is applied using an embossing cylinder drum at a pressure of 60 tons at around 180 degrees Celsius (° C.). Because of the front and backside coatings the fabric is not porous.

The material for the cover layer 304 may be a cloth product, with chemistry in the coatings and a leather-like appearance to the cloth, such as by Holliston Inc. (905 Holliston Mills Road, Church Hill, Tenn. 37642; www.holliston.com)

The material for the inlay substrate 302 may be Teslin™, a waterproof synthetic film, single-layer, uncoated with a thickness of 356 microns.

The material for the inlay substrate 302 may be PVC, PC, PE, PET, PETE, TYVEK, TESLIN, Paper or Cotton/Noil. The inlay substrate can also have special markings such as luminous threads, water marks, microscopic filings and optical polymer memory for additional security.

The inlay format is typically "3up" (for making three passport covers at once), and is generally planar and rectangular, having exemplary overall dimensions of 404.81 mm×182.56 mm×0.70 mm (thick). Each one of the three covers (A), (B) and (C) are generally rectangular, having exemplary dimensions of (404.81 mm/3)=134.94 mm×182.56 mm, with a thickness of 0.70 mm. In FIG. 3I, "A", "B" and "C", each represent a "transponder site" for a given passport cover (see FIG. 1G).

A hinge gap 316 may be cut or punched through the inlay substrate 302 and the cover layer 304, separating the "front" portion from the "back" portion of the passport cover(s).

An RFID chip module 308 and corresponding antenna wire 310 may be disposed in a recess 306 in the inlay substrate 302.

The inlay substrate 302 may be prepared by embedding an insulated wire (such as 80 µm) into the inlay substrate to form an antenna 110 with 4 or 5 turns and interconnecting the ends of the antenna wire to the chip module by means of thermo-compression bonding.

The chip module 308 may be disposed in a recess 306 in the inlay substrate. The recess may be slightly wider than the chip module. The recess may be a "stepped" recess, as shown, and may be a "window" recess extending completely through the inlay substrate 302.

The cover layer 304 may be laminated (joined) to the inlay substrate 302 using a polyurethane hot melt adhesive 314, such as approximately 50-80 µm thick. Prior to the adhesive process, the inlay substrate may be pre-pressed to ensure that the antenna wire does not protrude over (extend above) the surface of the Teslin™ substrate, in other words, to ensure that the antenna wire is fully embedded in the inlay substrate.

Non-reactive adhesives based on polyamide are typically not used in electronic passports for security reasons, as it would be possible to de-laminate the material by applying heat. Instead, reactive adhesive, moisture curing hot melt adhesive based on polyurethane, is used. Many are available.

The adhesive can be characterized by a high initial tack and a long open time (several minutes) or a short setting time (several seconds). In the latter case, the adhesive has to be reactivated using infra red light before the cover layer is attached to the inlay, or hot laminated within a certain period (within 1 to 2 hours). The adhesive cures exclusively in the presence of moisture and gains its final strength after 3 to 7 days.

The adhesive may be applied to the cover layer (cover material) at approximately 150 degrees Celsius, putting down a layer of 50 to 80 microns (µm). The inlay is applied to the cover layer (cover material) in web or in sheet form, and is then laminated together using a roll press. Thereafter, the laminated inlay with the cover layer (cover material) is cut to size and stored in a stack for 3 to 7 days in a storage area having a regulated temperature and humidity.

According to an embodiment of the invention, a transfer substrate such as Teflon may be coated with an adhesive layer, then later reactivating the adhesive layer through the application of heat and transferring the smooth side of the adhesive layer to the cover material. The process of providing a smooth adhesive finish on the cover material, especially in the hinge area, may facilitate the adhesive attachment of the passport booklet to the inlay cover. Portions of the process may be applicable to other process disclosed herein, and may be performed using the following steps.

Roller Coater Station: (FIG. 3K)

A conventional roller coater can be used to coat a transfer substrate, such as Teflon™, with an adhesive layer. The transfer substrate can be a sheet, or it can be continuous band (much in the way of a conveyor belt which passes under the roller coater.) The transfer substrate should be a non-stick material, such as Teflon. A suitable thickness is 0.230 mm.

The adhesive (polyurethane reactive glue) is applied to the transfer substrate with minimal pressure at a temperature of approximately 150° C.

The top surface (as shown) of the transfer substrate will thus be provided with an adhesive layer. And, since the surface of the transfer layer is very smooth (substantially "smooth as glass"), the resulting adhesive layer will also be substantially smooth, and of substantially constant thickness.

Cover Placement Station: (FIG. 3L)

After applying adhesive to the coated transfer substrate, a layer of cover material may be placed onto the adhesive-coated transfer substrate. The cover material may be in sheet form. In the figure, the transfer substrate is adhesive-side up. A robot can place a sheet of cover material "face down" onto the transfer substrate. The "inner" surface of the sheet of cover material is disposed against the adhesive-coated surface of the transfer substrate. The inner surface may have acrylic material on it.

Alternatively, the transfer substrate could be above the sheet of cover material (FIG. 3L, inverted).

Lamination Station: (FIG. 3M)

Then at a belt lamination station, the adhesive is reactivated and transferred to the cover material by applying heat and pressure (arrows) to the "sandwich" of coated transfer substrate and cover material.

The pressure applied by the belt laminator to the sandwich may be 2.5 Newtons. The reactivation temperature is approximately 160° C. The adhesive solidifies, non sticky, after the opening time of several seconds.

The Cover Placement Station and Lamination Station may be combined with one another.

Finishing Station: (FIG. 3N)

In a final step, the cover material (now with adhesive on it) is removed from the transfer substrate, with the adhesive layer being transferred to the inner surface of the cover material. Next, the cover material (or layer, or simply "cover") may be laminated to an inlay substrate having a chip module and antenna wire.

Laminating the Cover to the Inlay Substrate

In preparing the cover material for adhesive attachment to the inlay using polyurethane reactive glue, the following steps may be performed to augment the adhesion and shear strength:

since the textile of the cover material may be coated with an acrylic, it may be beneficial to first (before laminating) partially remove acrylic around the area of the chip module and antenna by ablating the material using a UV laser, and secondly to reduce the surface tension of the material by applying (increasing) temperature before coating. The latter procedure prevents curling of the material after lamination with the inlay layer such as Teslin™.

The use of a transfer substrate or carrier layer for the purpose of forming an antenna structure and mounting the antenna structure to an inlay substrate is described below.

Forming Antenna Structures on an Antenna Substrate and Transferring them to the Inlay Substrate Generally, a plurality of antenna structures (or simply "antennas") may be formed (produced) a plurality of antenna sites on an "antenna substrate" which is other than (separate from) the inlay substrate, such as by using the ultrasonic embedding techniques described hereinabove (for example, U.S. Pat. No. 6,233,818).

Some of the techniques described hereinabove for forming an antenna (antenna structure) on an inlay substrate may be applicable to forming antenna structures on the antenna substrate. For example The antenna structures may be formed on the antenna substrate using any of the techniques described hereinabove, including (but not limited to) ultrasonically scribing an antenna wire onto the substrate, first forming channels for accepting the antenna wire and laying the antenna wire into the channels (FIGS. 2G,H), and first forming a wide trench (FIG. 3F) in the substrate for accepting at least two turns of an antenna wire.

The antenna structure may comprise self-bonding wire. The antenna structure may comprise an etched conductive film. The antenna structure may comprise channels formed in the antenna substrate which are subsequently filled with a conductive material (compare FIGS. 2I,J). The antenna structure may comprise channels formed in an adhesive layer on the antenna substrate which are subsequently filled with a conductive material (compare FIGS. 2K,L).

A transponder site may comprise a selected area of an overall inlay substrate (such as Teslin™ or PC) and an RFID chip module (or die, or chip) which may be mounted in a recess.

The antennas (antennae) may be transferred from the antenna substrate to transponder site(s) on an inlay substrate, and connected with the chip module(s) at the transponder sites. Alternatively, a chip module may be mounted to the antenna on the antenna substrate, and the combination(s) of antenna and chip module may be transferred to the transponder site(s).

Various cover layers and underlay layers may be applied to the inlay substrate with antenna and chip module in place, and the several transponder sites may be separated from one another, becoming individual secure documents such as electronic passports or ID cards.

The separate substrate upon which the antenna structures are formed may be referred to as a "carrier substrate", or a "transfer substrate", and may comprise a layer or a film of material. In its various forms the separate substrate upon which the antenna structures are formed may simply be referred to as an "antenna substrate". The antenna substrate may be a single layer (monolayer) substrate or a multi-layer substrate.

In some embodiments, the antenna substrate may be in the form of an elongate continuous web (or strip) of synthetic material upon which the plurality of antenna structures may be formed, one after the other, in a linear sequence (or one row of "n" antenna structures). The antenna substrate in such a "web format" may for example be approximately one antenna structure wide (such as several centimeters wide), and several (n) antenna structures long (such as several meters long). In such a web format, the pattern and layout of the several (n) antenna structures on the antenna substrate may be independent of a pattern and layout of a plurality of corresponding transponder sites on the inlay substrate.

In some embodiments, a 2-dimensional array (such as "n" rows and "m" columns) of antenna structures may be formed on the antenna substrate, such as for transfer "en masse" (all at once) to the plurality of corresponding transponder sites on an inlay substrate. In this case, the pattern and layout of the (n×m) antenna structures on the antenna substrate may correspond to a pattern and layout of corresponding transponder sites on the inlay substrate.

In some embodiments set forth herein, a single antenna structure at a single antenna site on the antenna substrate may be described, as exemplary of other of the several antenna structures at other antenna sites on the antenna substrate.

The antenna substrate may be formed of a synthetic material, such as PVC or PC. The material of the antenna substrate may be the same as, or different than the material of the inlay substrate. The antenna substrate may be formed of non-synthetic material, such as aluminum or paper. The antenna substrate may be a multi-layer substrate, comprising a layer or film of material on an underlying carrier layer. For example, the antenna substrate may comprise a layer of adhesive on an underlying carrier substrate or web (such as Teflon™), and the antenna structures may be formed in the layer of adhesive.

Each of the antenna structures may comprise a flat (generally planar) coil having a number (such as four or five) turns of an elongate electrical conductor (such as a wire, a foil, conductive material, conductive material disposed in a channel, and the like), generally having two "termination ends" (or "terminal ends"). The termination ends may be the two ends, end segments, end portions, or any suitable "connection portions" of the antenna structure. Refer to FIG. 1E.

The antenna structure(s) may be mounted to either (upper or lower) surface of the antenna substrate (although normally formation of the antenna structures would proceed on the upper/top surface of the antenna substrate), and the antenna substrate may be inverted for transferring the antenna structure(s) to the inlay substrate. During the process of transferring an antenna structures, the inlay substrate would normally be disposed under the antenna substrate (or relevant portion thereof).

An inlay substrate may be prepared with a plurality of RFID chips or (chip modules) located at a plurality of transponder sites in an inlay substrate. For example, a 2-dimensional array ("n" rows, "m" columns) of "transponder sites" on a single inlay substrate. The inlay substrate may be a single layer substrate or a multi-layer substrate, and may be formed of Teslin™, PC, other synthetic material or paper.

At each transponder site, the RFID chip (or chip module) may be disposed in a recess (compare FIGS. 2A,B) extending into a surface of the inlay substrate. The recess for the RFID chip (or chip module) may be formed in the inlay substrate by laser ablation. In some embodiments set forth herein, one transponder site may be described, as exemplary of other of the plurality of transponder sites on the inlay substrate.

Channels (compare FIG. 2C), or more likely wide trenches (compare FIG. 3F) may be prepared in the inlay substrate for receiving the antenna structures (when they are transferred from the antenna substrate to the inlay substrate), and these channels or wide trenches may extend to and from edges of recesses (compare FIGS. 2F, 3G) in which the RFID chips (or chip modules) are disposed, or even at least partially into the recess. The channels or wide trenches may be formed in the inlay substrate by laser ablation.

A wide trench to accept an antenna structure may be partially filled with adhesive. Alternatively, a layer of adhesive could be disposed over the entire area of the inlay substrate covering the trench for the antenna structure and the recess for the chip module. In placing the chip or chip module in its laser ablated recess, the adhesive would act as an anti-fretting medium to reduce the risk of micro-cracking especially in polycarbonate cards.

Generally, a plurality of antenna structures may prepared in advance on the antenna substrate, and transferred on an "as needed" basis selected transponder sites on the inlay substrate, and connected to the RFID chip (or chip module) at the transponder sites.

In some embodiments, the antenna structures may be transferred one-by-one (individually) to selected ones of the transponder sites, which may comprise "singulating" or separating the antenna structures individually from the antenna substrate. In some embodiments, more than one antenna structure may be transferred at once ("en masse") to corresponding more than one transponder sites on the inlay substrate.

For transferring antenna structures from the antenna substrate to selected transponder sites on the inlay substrate, there are a variety of possibilities, including but not limited to:
  a pick & place machine may be used to remove (pick) individual antenna structures from the antenna substrate and transfer (place) them to selected transponder sites on the inlay substrate,
  a portion of the antenna substrate surrounding (encompassing, supporting) the given antenna structure may be disposed facing a selected transponder site, and mechanical means such as pins may act upon the antenna substrate (such as applying a force to the back side of the antenna substrate) cause the antenna structure(s) to be released (ejected) from the antenna substrate and mounted to (disposed onto) the inlay substrate,
    the inlay substrate may be prepared with channels for receiving corresponding turns (such as wires) the antenna structure
  a portion of the antenna substrate surrounding (encompassing, supporting, carrying) the given antenna structure may be perforated, and in the process of transferring the antenna structure to the inlay substrate, some "residual" antenna substrate material may accompany the antenna structure
    the inlay substrate may be prepared with wide trenches for receiving the antenna structure with residual antenna substrate material
  a laminating process (generally, heat and pressure) may be used to transfer antenna structures from the antenna substrate to transponder sites on the inlay substrate.

Because the antenna is first arranged on or in (adhered to or at least partially embedded in) the carrier layer (film), the pitch (distance between the antenna wires or conductor tracks) and the shape of the antenna remain intact during the transfer and mounting of the antenna structure and its termination ends. The fixing of the antenna onto or into the inlay substrate may be through the application of heat and pressure.

In the "modified coil winding" technique disclosed in US 2008/0314990 (Rietzler), there is a one-to-one correspondence between the number and format (layout, pattern) of antenna devices (22) on the sheet (13) and chip modules (21) on the laminator plate (17). Similarly, in U.S. Pat. No. 7,229,022 (Rietzler) there is a one-to-one correspondence between the number and format (layout) of antennas (12) on the substrate (11) and the chip modules (15) on the second substrate (14). This correspondence requires a high level of registration.

In the Rietzler techniques, generally, the antennas are formed on what is the inlay substrate, not on a separate antenna substrate which is ultimately removed. There is no transfer of antenna structure involved.) The one-to-one correspondence of antennas to transponder sites is due to the fact that the antennas are indeed formed at the transponder sites, and the chip modules are added thereto. (Compare U.S. Pat. No. 6,233,818 which suggests installing chip modules from the bottom of the inlay substrate into recesses bridged by the antenna wire.)

In some embodiments of the techniques disclosed herein for forming antenna structures on an antenna substrate which is separate from the inlay substrate, then individually transferring the "pre-formed" antenna structures to transponder sites on inlay substrate, there need not be a correspondence between the number and/or layout of antenna structures on the antenna substrate and the number and/or layout of transponder sites on the inlay substrate. For populating the total number of transponder sites of a given inlay substrate, there should of course be at least a sufficient number of antenna structures available on the antenna substrate, but their layout (arrangement or positioning on the antenna substrate with respect to one another) is essentially entirely independent of the layout (arrangement or positioning) of the transponder sites on the inlay substrate.

In some embodiments of the techniques disclosed herein for forming antenna structures on an antenna substrate which is separate from the inlay substrate, then transferring the "pre-formed" antenna structures en masse (several at once) to transponder sites on inlay substrate, there generally would be a correspondence between the number and/or layout of antenna structures on the antenna substrate and the number and/or layout of transponder sites on the inlay substrate.

In some embodiments of the techniques disclosed herein for transferring the "pre-formed" antenna structures from the antenna substrate to the inlay substrate, whether one-by-one or en masse, during the transfer process the termination ends of the antenna structure are fixed relative to each other on the antenna substrate and cannot be misaligned during placement (transfer).

In some embodiments of the techniques disclosed herein for transferring the "pre-formed" antenna structures from the antenna substrate to the inlay substrate, whether one-by-one or en masse, after the transfer process the antenna substrate is substantially removed (a small portion of the antenna substrate may remain in some embodiments) or taken away, no longer being associated with the antenna structure(s) which has (have) been transferred. The antenna substrate may or may not be reused for forming subsequent antenna structures.

An Illustration of the Process

FIG. 4 illustrates a representative antenna structure 420 disposed on an inlay substrate 402 at a selected transponder site 400. There may be a plurality of such transponder sites on the inlay substrate 402. The dashed lines indicate that there may be additional transponder sites above, below, to the left of and/or to the right of the illustrated transponder site 400. For example, there may be 2 rows (extending one atop the other, across the page), each row having four transponder sites. For example, there may be three rows, each row having three transponder sites. Generally, all of the transponder sites will be substantially identical with one another, and eventually will be separated from the remaining transponder sites in the inlay substrate in the process of making secure documents such as electronic passports or ID cards. One transponder site may be described in detail, as representative of other transponder sites on the inlay substrate.

A chip module 408 may be disposed in a recess 406 in a surface of the inlay substrate 402, and may have two terminals (or terminal areas) 408a and 408b. The antenna structure 420 may be formed of several (such as four or five, although only two are shown) turns of wire 410. The antenna wire may have two termination ends (or connection portions) 410a and 410b. The two termination ends 410a and 410b may be disposed over respective terminals (terminal areas) 408a and 408b of the chip module 408 for connection thereto, and may be physically and/or electrically connected (typically bonded) thereto using conventional means. A transponder site having a chip module and an antenna connected thereto may be referred to as a "transponder". Compare FIGS. 1A and 1B.

The inlay substrate 402 may be prepared with a wide antenna trench (laser ablated or mechanically milled) to accept the antenna structure and a recess (also laser ablated or mechanically milled) or window to accept the chip or chip module. The trench may be a wide trench.

The interconnection of the termination ends of the antenna structure 420 may be connected to a chip (or chip module) residing in the inlay substrate (laser ablated recess or cavity), in a window in the inlay substrate supported by an underlying layer of material or on the inlay substrate.

The inlay substrate 402 may comprise a synthetic material such as Teslin™ having a thickness of approximately 356 µm, or polycarbonate (PC) having a thickness of approximately 185 µm, and may be in a sheet format. The antenna wire 410 (generally exclusive of the connection portions) may be mounted to the inlay substrate 402 using conventional means, such as by scribing, sticking or embedding. Compare U.S. Pat. No. 6,233,818. The antenna wire 410 (generally exclusive of the connection portions) may be disposed in channels which are preformed in the surface of the inlay substrate, such as by laser ablation. Compare FIG. 2C. The recess may be formed by in the inlay substrate by laser ablation. Compare FIGS. 2A,B FIG. 4A illustrates a plurality of antenna structures (or simply "antennas") 420A which have been formed on an antenna substrate (carrier or transfer substrate, or web, or film or layer) 412A at a plurality of antenna sites 414A on the antenna substrate 412A. The antenna structure 420 may comprise antenna wire 410 which may be mounted to (including at least partially embedded in) the substrate using self-bonding wire, in a conventional manner (compare FIG. 1B), such as having a main portion comprising four or five turns of wire. Termination portions (connection portions) 410a and 410b of the antenna wire 410 (hence, of the antenna structure 420) extend from the main portion and are positioned so that they will be aligned with corresponding terminal areas (408a and 408b) on chip modules (408) at transponder sites (400B) on an inlay substrate (402B).

The dashed lines on the antenna substrate 412A indicate that there may be additional antenna sites 414A above, below, to the left of and/or to the right of the illustrated antenna site. In FIG. 4A, a single row of (two) antenna sites 414A is illustrated. The antenna substrate 412A may be in the form of an elongate web having a long row of several antenna structures 420A.

The antenna substrate (or carrier layer, or web, or film) 412A may comprise a paper or a synthetic material, such as an overlay material having a thickness between 30 and 80 microns and can be identical to the material used for the inlay substrate (such as PVC or PC) which forms the inner layer of a contactless smart card or national identity card. In the case of an electronic passport having a monolayer substrate (such as Teslin™) as the inlay substrate, the carrier layer may be a layer of polycarbonate or a layer of adhesive such as polyurethane. Compare FIGS. 2G and 2H. The antenna substrate (carrier layer) may be in the form of an endless web or reel (spliced as required) carrying (supporting, upon which may be formed) a plurality of antenna structures.

The antenna structures 420A may be formed in any of the manners described hereinabove with regard to mounting antenna wire on an inlay substrate, such as by ultrasonic sticking of wire to the antenna substrate 412A.

The antenna can be arranged on or in the antenna substrate (carrier layer, carrier film) by scribing a wire conductor onto or into the material, such as by means of ultrasonic embedding. An 80-112 µm diameter wire may be embedded partially in a carrier film having a thickness of 50-80 µm. The wire conductor can be an insulated wire or a self-bonding wire.

As an alternative to wire, the antenna could be formed from a sheet of metal such as a copper foil with a layer of passivation to prevent oxidization, and the shape and tracks of the antenna could be realized by cutting the copper using a UV picosecond laser.

The antenna substrate (carrier layer, carrier film) may be provided with channels for accepting a wire conductor, electronic ink, conductive paste, electrically charged nano-particles or any conductive medium. A laser may be used to activate the medium for electrical conduction.

The removal (singulation) of the antenna structure and its termination ends from the antenna substrate (carrier layer, carrier film) may be performed using a die punch, a laser for cutting or by means of lamination (heat and pressure), before transferring and mounting onto or into an inlay substrate. A contact transfer process (which may be a form of lamination) is also described.

The exposed antenna could be adhesively attached to the antenna substrate (carrier layer, carrier film) before or after the laser ablation/cutting process. The antenna may also be formed and mounted to the antenna substrate (carrier layer, carrier film) through the conventional method of coil winding (radial or flyer principle).

FIG. 4B illustrates an inlay substrate 402B comprising a plurality of transponder sites 400B which are prepared on the inlay substrate. The dashed lines indicate that there may be additional transponder sites above, below, to the left of and/or to the right of the illustrated transponder site. A single row of transponder sites 400B is illustrated. The inlay substrate 402B may comprise a synthetic material such as Teslin™ or polycarbonate (PC), having respectively a thickness of 356 µm and 185 µm, and may be in a sheet format. At each transponder site 400B, a chip module 408 may be disposed in a recess 406 in a surface of the inlay substrate 402B. The chip module 408 may have two terminals 408a and 408b.

Alternatively, the chip module may be mounted to the antenna on the antenna substrate prior to transfer, and the combination(s) of antenna and chip module may be transferred together to the transponder site(s). In such as case, the "transponder site" would essentially consist of an area of the inlay substrate designated for receiving a chip module and antenna, without the chip module installed in the recess. This designated area may be distinguished by (i) a recess in the inlay substrate for receiving the chip module, (ii) an area of the inlay substrate adjacent the recess for receiving the turns of the antenna structure, and (iii) a remaining area around the chip module and antenna (after installed) for defining a suitable overall size for the secure document.

FIG. 4C illustrates such an arrangement. A chip module 408 is connected by its terminal areas 408a and 408b to terminal ends 410a and 410b of an antenna structure 420 which has been formed at an antenna site 414C on an antenna substrate 412C. The antenna substrate 412C is above an inlay substrate 402C for transferring (by any of the techniques described herein) the antenna structure with chip module to a transponder site 400C on an inlay substrate 402C having a recess 406C for receiving the chip module. At the back of the recess 406C, two channels 426 are visible for receiving the terminal ends 410a and 410b of an antenna structure 420 may be seen, and a wide trench 428 for receiving the main body (turns) of the antenna structure 420 can also be seen. The antenna structure 420 may be wire which is embedded onto or into the antenna substrate 412C. Channels 424 (shown exaggerated in size, for illustrative clarity) may be provided in the antenna substrate 414C for receiving the antenna wire.

Various techniques are described hereinbelow for transferring antenna structures 420A individually (one-by-one) or several at a time (en masse) from the antenna substrate 412A to one or more transponder sites 400B on the inlay substrate 402B.

A resulting product (or interim product) may look substantially like the transponder shown in FIG. 4, with an antenna structure 420a connected to the chip module 408. Cover layers and/or overlay (or underlay) layers may be provided in a final product, such as a secure document which may be an electronic passport or ID card. Refer to FIGS. 1F and 1H.

Security features such as markings may be incorporated into the antenna substrate (carrier layer) 412A, such as graphic designs in an area around or underneath the antenna structure. This would create a visible "security feature".

A hologram may be created using the laser on the underside of the inlay substrate 402B, such as opposite the chip module. This would create a visible "security feature".

Some inlay substrates comprise polycarbonate (PC), and tend to develop micro cracks in the area of the chip module (around the recess). To reduce the formation of (prevent) micro cracks developing in polycarbonate (PC), at the position of the chip module (around the edge of the recess), the material of the inlay substrate can be laser treated, a form of annealing it at the threshold fluence (just below ablating, with incubation effect).

Some Embodiments

FIG. 5A shows a representative antenna structure 520 (compare 420A) having a representative termination end 510a (compare 410a, 410b) which has been formed on a representative antenna site 514 (compare 414A) on an antenna substrate 512 (compare 412A). A representative transponder site 500 (compare 400B) on an inlay substrate 502 (compare 402B) comprises a chip module 508 (compare 408) disposed in a recess and having a representative terminal 508a (compare 408a, 408b).

A tool such as a conventional "pick & place" gantry (such as a conventional surface mount technology pick and place machine) may be used to remove (pick) individual antenna structures 520 off of the antenna substrate 512 and transfer them, one-by-one, in an aligned manner, to selected transponder sites 500 on the inlay substrate 502. The pick & place gantry may position (place) the antenna structure 520 with its termination end 510a located over a respective terminal 508a (compare 408a and 408b) of the chip module 508 for connection thereto using conventional means (such as thermocompression bonding). The antenna structure 520 (and termination end 510a) is shown in dashed lines on the antenna substrate 512 from whence it was picked, and in solid lines on the inlay substrate 502 whereat it is placed.)

The technique of FIG. 5A illustrates that the layout of antenna structures on the antenna substrate may be completely independent of the layout of transponder sites (and position of chip modules within the transponder sites) on the inlay substrate. In this embodiment, the position (or location) of the antenna substrate, and its orientation ("face up", as shown) is substantially arbitrary with respect to the position of the inlay substrate (other than both the antenna substrate and inlay substrate being within "reach" of the pick & place gantry).

FIG. 5B shows a representative antenna structure 520 having a representative termination end 510a which has been formed on a representative antenna site 514 on an antenna substrate 512. A representative transponder site 500 on an inlay substrate 502 comprises a chip module 508 disposed in a recess and having a representative terminal 508a.

In this embodiment, the antenna substrate 512 is oriented "face down", with the antenna structure 520 aligned over and spaced only slightly apart from the transponder site 500 on the inlay substrate 502. The gap between the antenna substrate 512 and the inlay substrate 502 is greatly exaggerated in this "exploded" view. A pick and place tool can also be used to transport the antenna substrate or portion thereof, and the antenna substrate transporting an antenna structure may be held in position using vacuum through micro-holes in the pick & place tool.

Mechanical means 530 may be employed for releasing (separating, ejecting) the antenna structure 520 from the antenna substrate 512, in an aligned manner onto the transponder site 500, with the termination end 510a on the terminal 508a for subsequent bonding thereto. The mechanical means 530 may comprise a pin or pins pressing on the back side (top, as viewed) of the antenna substrate 512. The pins may extend through holes in the antenna substrate 512 to act directly on the antenna structure 520. The mechanical means 530 may cause flexing (or bowing) of the antenna substrate 512 so that the antenna structure 520 disassociates itself therefrom ("pops off") as a result of the deformation of the antenna substrate 512. The antenna structure 520 (and termination end 510a) is shown in dashed lines on the antenna substrate 512, and in solid lines on the inlay substrate 502. If the chip module is first mounted and connected to the antenna structure (prior to making the transfer), this may help maintain alignment of the termination ends of the antenna structure, and may also facilitate separation of the antenna structure from the antenna substrate.

Alternatively, the means for releasing the antenna structure 520 from the antenna substrate 512 may be a laser (beam) directed at the back side of the antenna substrate 512 tracing a path corresponding to the "footprint" or outline of the antenna structure (on the front side of the antenna substrate 512) to cause (or assist) in releasing the antenna structure 520 from the antenna substrate 512 onto the inlay substrate 502. The fluence of the laser should be sufficient to heat a portion of the antenna substrate 512, causing softening or distorting, without penetrating the antenna substrate 512.

In this embodiment, the antenna structure 520 may have been formed on the antenna substrate 512 with the antenna substrate "face up", and the antenna substrate 512 is inverted prior to its being positioned over the inlay substrate 502 for transferring the antenna structure 520 from the antenna substrate 512 to the inlay substrate 502.

FIGS. 5C,5D,5E illustrate an embodiment wherein the antenna substrate 512 is perforated, and at least a portion 512a of the antenna substrate 512 supporting the turns of the antenna structure 520 (exclusive of the termination ends 510a, 510b) may remain with the antenna structure 520 when it is transferred from the antenna substrate 512 to the inlay substrate 502.

More particularly, a row (or ring) of perforations 522 is disposed interior (adjacent, inside of) the turns of the antenna structure 520, and a row (or ring) of perforations 524 is disposed exterior (adjacent, outside of) the antenna structure. The perforations may be formed by laser ablation of the substrate material, in a manner similar to forming recesses (compare FIGS. 2A,2B), channels (compare FIGS. 2C, 2D, 2E, 3E) or wide trenches (compare FIG. 3F).

In FIG. 5C, the antenna substrate 512 is illustrated herein as a carrier film (web). The portion 512a of the antenna substrate 512 remaining with the antenna structure 520 comprises a ring of antenna substrate material under the antenna structure 520 between the inner and outer rows of perforations 522 and 524. (The angles at which the termination ends extend from the main body portion of the antenna structure are shown differently in FIG. 5C than in FIG. 4A to suggest that various antenna configurations are possible.)

Additional perforations (not shown) may be provided in the antenna substrate 512 so that a portion of antenna substrate material (or carrier layer or web) may remain with the antenna structure 520, supporting the termination ends 510a and 510b, when the antenna structure 520 is transferred from the antenna substrate 512 onto the inlay substrate 502. Alternatively, by first mounting and connecting the chip module to the antenna structure (prior to the transfer), the termination ends will stay aligned. Where antenna substrate material accompanies the antenna structure during transfer, particularly supporting the termination ends of the antenna wire, openings may be formed in the antenna substrate at the location of connection portions of the termination ends so as to facilitate bonding of the connection portions to the terminals of the chip module.

FIG. 5D illustrates a relevant portion of the antenna structure 520 (comprising four turns of wire) prior to the antenna structure 520 being separated from the antenna substrate 512. As indicated by this figure, the antenna structure 520 may be formed on the antenna substrate 512 with the antenna substrate "face up".

FIG. 5E illustrates a relevant portion of the now "singulated" (separated from the antenna substrate 512) antenna structure 520 (comprising four turns of wire) prior to the antenna structure 520 after being separated from the antenna substrate 512. As indicated by this figure, the antenna structure 520 with remaining portion 512a of the antenna substrate 512 may first be inverted ("face down") prior to transferring the antenna structure to the inlay substrate. As shown in this figure, the antenna structure 520 (with remaining portion 512a of the antenna substrate 512) may be disposed in a wide trench 504 formed in the inlay substrate 502. Compare FIG. 3F (322).

Before further processing of the carrier layer in transferring the antenna structure to an inlay substrate, the carrier layer with the arranged antenna(e) may be laminated to create a smooth surface, "sealing" around the antenna. This may result, for example, in some (a thin film) of the antenna substrate material sticking to and staying with the antenna structure, which may result in greater stability of the antenna structure during the transfer process.

These FIGS. (5C, 5D, 5E) illustrate that a portion of the antenna substrate (carrier web) may be removed, with a given antenna structure mounted thereto, and positioned it so that the antenna structure 520 is aligned directly over a given transponder site (500), then causing separation of the portion of the carrier web with the antenna structure, directly over the transponder site. The antenna substrate 512 may have a sufficient number of antenna structures 520 to populate an entire array of transponder sites (such as three, or six, or nine, or more) on an inlay substrate sheet.

The process of transferring the antenna structure(s) to the transponder site(s) may be performed by first contacting the relevant portion of the antenna substrate (carrier web) with the transponder site, the antenna structure (with or without remaining carrier web) "sticks" (adheres) to the transponder site, then removing (taking away) the antenna substrate. This phenomenon may be aided by using a different (dissimilar) material for the antenna substrate than for the inlay substrate, and may also be encouraged by performing a laminating process. For example, using a band laminator (such as http://www.meyer-machines.com/engl/), or a roll coater, antenna structures formed in a PVC antenna substrate may transfer readily to an inlay substrate comprising Teslin™. A coated, insulated or self-bonding wire may be used for the antenna structure, and surface tension, or simple adhesion may be the principle at work in "attracting" the antenna wire to the dissimilar material of the inlay substrate. Channels or a wide trench may be formed in the inlay substrate prior to the transfer, the structure of which may also aid in the transfer process. Compare the profiled channel shown in FIG. 2E.

FIG. 6A shows a portion of a representative antenna structure 620 which has been formed on a representative antenna site 614 on an antenna substrate 612. The termination ends of the antenna structure are omitted, for illustrative clarity. Compare FIGS. 4, 4A, 5B, 5D. The antenna substrate 612 may comprise PVC.

FIG. 6B shows the antenna substrate 612 inverted ("face down") and disposed on a representative transponder site 600 on an inlay substrate 602. The inlay substrate 602 may comprise Teslin™. The chip module (having terminals) which may be disposed at the transponder site (and which may be disposed in a recess in the inlay substrate) is omitted, for illustrative clarity. Compare FIGS. 4, 4B, 5B The antenna substrate 612 and inlay substrate 602 are put in (or through) a laminator, such as a band laminator, having a upper roller (or band) 632 and a lower roller (or band) 634. Compare FIGS. 3A, 3K. Some exemplary parameters for effecting the transfer of an antenna from a PVC sheet to a Teslin sheet may include: applying pressure and/or heat may, such as 25 n/m² at 75-80° C., feeding both sheets (substrates) though the band laminator at a speed of 2 m/sec. This may be done with no cooling.

FIG. 6C shows that after laminating, the antenna substrate 612 may be removed, leaving the antenna structure 620 mounted to the inlay substrate 602.

Restated more generally, the antenna substrate 612 which is "face down" and the inlay substrate 602 which is "face up" are brought into face-to-face aligned contact with one another and subjected to a physical process, such as a laminating process, which may involve at least one of pressure, heat or time in an amount which is sufficient to cause the antenna structure 620 to transfer from the antenna substrate 612 to the inlay substrate 602. This process may be referred to as a "contact transfer" process.

The termination ends of the antenna structure may be physically disposed on the terminal areas of the chip module after laminating (or after any of the other transfer techniques disclosed herein, or their equivalents). It is also possible that an electrical connection between the termination ends of the antenna structure and the terminal areas of the chip module may be effected during the transfer process (laminating or otherwise), without requiring a separate subsequent bonding process (such as thermocompression bonding). For example, a conductive adhesive may be disposed on the terminal areas of the chip module prior to transferring the antenna structure, resulting in an electrical connection between the termination ends of the antenna structure and the terminal areas of the chip or chip module.

The physical process referred to in the contact transfer process may not involve laminating, but rather simply causing the antenna substrate and inlay substrate to be at different temperatures (causing a temperature differential) and bringing them in contact with one another. For example, the antenna substrate may be in web form, supported by a heated roller or conveyor, and the inlay substrate may be at room temperature (cooler than the antenna substrate), or cooled, in which case the "physical process" would simply be causing there to be a temperature differential between the antenna substrate and the inlay substrate. A physical process such as causing there to be an airflow (or flow of inert gas) between the opposing surfaces of the antenna substrate and the inlay substrate may also assist in transferring the antenna structure(s) from the antenna substrate to the inlay substrate.

Physical characteristics (or properties) of the antenna wire and/or antenna substrate and/or inlay substrate may be selected to facilitate the transfer of antenna structure from the antenna substrate to the inlay substrate. For example, the antenna substrate may be selected to have a lower glass transition temperature than the inlay substrate. (see http://plastics.inwiki.org/Glass_transition_temperature) Surface tension may also be a factor. Gravity may have an effect since the inlay substrate may be disposed under the antenna substrate during the transfer.

Phrased differently, at least one antenna site 614 of an antenna substrate 612 which has been prepared with an antenna structure 620 (and optionally also with a chip module connected to termination ends of the antenna structure) may be contacted with at least one transponder site 600 on an inlay substrate 602 (which may have been prepared with a chip module), thereby transferring the antenna structure 620 from the at least one antenna site 614 of the antenna substrate 612 to the at least one transponder site 600 on the inlay substrate 602.

The inlay substrate 612 may then be removed, leaving the antenna structure 620 positioned with its termination ends (compare FIG. 4, elements 410a, 410b) on the terminal areas (compare FIG. 4, elements 408a, 408b) of the chip module for connection (such as by thermo compression bonding, or gluing, or other process) thereto. Cover layers and the like may be applied to the resulting transponder site 600 with chip module and with antenna, thereby forming a secure document such as an electronic passport or ID card.

The antenna structures 620 may be formed (fabricated) in a "web format", or a single row of several antenna structures (compare FIG. 5C), wherein the antenna structures 620 may be transferred individually to selected ones of a plurality of transponder sites on an inlay substrate. An entire array of transponder sites may be populated one-by-one with antenna structures in this manner.

The contact transfer process described herein may also be performed in an "array format" (compare FIGS. 4A, 4B), wherein a plurality of antenna structures may be formed with a given layout (such as an n×m array) of antenna sites on an antenna substrate and transferred all at once (en masse) to a similar plurality of transponder sites on an inlay substrate having a similar layout (such as an n×m array).

FIG. 6D shows a plurality of antenna structures 670 (compare 420, 520, 620) formed on a 2×2 array of antenna sites 664 (compare 414A, 514, 614) on an antenna substrate 662 (compare 412A, 512, 612). Each antenna structure 670 is shown having only one turn of wire (compare 410), for illustrative clarity. Each antenna structure 620 has two termination ends 660a, 660b (compare 410a/b, 510a/b). The antenna substrate 662 may comprise a layer of PVC having a thickness of 200 μm.

FIG. 6E shows a plurality of chip modules 658 (compare 408, 508) formed on a 2×2 array of transponder sites 650 (compare 400B, 500, 600) on an inlay substrate 652 (compare 402B, 502, 602). Each chip module 658 has two terminal areas 658a, 658b (compare 408a/b, 508a Recesses in the inlay substrate are omitted, for illustrative clarity. The inlay substrate 652 may comprise a layer of Teslin™ having a thickness of 356 μm. The dashed line at each transponder site 614 indicates (schematically) where the antenna structure 670 will be disposed (after transfer), and may be a wide trench 672 (compare 322) formed in the inlay substrate 652 for receiving the antenna structure 670.

FIG. 6F shows the antenna substrate 662 being brought into face-to-face contact, or into near (almost) face-to-face contact with the inlay substrate, for effecting the transfer of at least one (two illustrated) antenna structures 670 from the antenna substrate 662 to the inlay substrate 652. This figure is an exploded view. Means for laminating, which may include means for effecting any of the physical processes described hereinabove (pressure, temperature, temperature differential, air flow, etc.) may be used to cause or to assist the antenna structures 670 being transferred from the from the antenna substrate 662 to the inlay substrate 652, in an aligned manner, for subsequent connecting of the termination ends (only one end 660a is visible in the cross-section) of the antenna structures 670 to the terminal areas (only one terminal area 658a is visible in the cross-section) of the chip modules 658.

Some Conclusions, Benefits and Additional Features

Using the techniques disclosed herein may result in the aligned placement of one or more antenna structures on one or more transponder sites for connecting (such as by bonding) termination ends of the antenna structure(s) to corresponding terminal areas of an RFID chip or chip module at the transponder site.

In the process, insulation may be removed from insulated antenna wire at the termination ends (connection portions) of the antenna wire.

An entire antenna structure (typically comprising four or five turns of antenna wire) may be disposed in a wide antenna trench prepared in the inlay substrate. (compare FIG. 3F)

Generally, using the techniques disclosed herein, different format inlays (different arrangements of transponder sites on an inlay sheet) are readily accommodated, requiring only a simple programming change—where to place the antenna structure on the inlay substrate (transponder site)—the position of the target transponder site is programmable, requiring no mechanically adjustments for different inlay formats.

The material of the antenna substrate (carrier substrate) upon which the antenna structures are formed ("pre-fabricated") may be the same or different than the material of the inlay substrate upon which the antenna structure is transferred (mounted) for connection to an RFID chip or chip module.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. A method of making a transponder comprising an inlay substrate, an RFID chip and an antenna structure, characterized by:

forming a wide trench in the inlay substrate for accepting the antenna structure; and after forming the trench, disposing the antenna structure in the trench;

wherein:

the transponder is located at one of a plurality of transponder sites on the inlay substrate; and further comprising:

preparing a plurality of transponder sites on an inlay substrate, each transponder site comprising a defined area of the inlay substrate;

forming a plurality of antenna structures on an antenna substrate which is separate from the inlay substrate; and removing given antenna structures from the antenna substrate and transferring them to selected ones of the transponder sites.

2. The method of claim 1, wherein:
the antenna comprises a number of turns; and
the trench is several times wider than a cross-dimension of a single turn of the antenna structure.

3. The method of claim 1, wherein:
the antenna comprises a number of turns; and
the trench is approximately as deep as a cross-dimension of a single turn of the antenna structure.

4. The method of claim 1, wherein:
the antenna structure comprises a wire, a foil or a ribbon.

5. The method of claim 1, wherein:
turns of the antenna structure are laid into the trench sequentially, turn-by-turn.

6. The method of claim 1, wherein;
the turns of the antenna structure are scribed into the trench using a sonotrode tool.

7. The method of claim 1, wherein:
the antenna structure is preformed, and disposed as a single unit into the trench.

8. The method of claim 1, further comprising:
connecting end portions of the antenna structure with terminals of the chip.

9. The method of claim 1, further comprising:
dispensing glue in the trench.

10. The method of claim 1, further comprising:
disposing a layer of adhesive over the inlay substrate.

11. The method of claim 1, further comprising:
forming a recess in the inlay substrate; and
installing an RFID chip in the recess.

12. The method of claim 1, wherein preparing a plurality of transponder sites comprises:
installing RFID chips in recesses at the transponder sites.

13. The method of claim 1, wherein:
a plurality of antenna structures are transferred one-by-one from the antenna substrate to selected ones of the transponder sites.

14. The method of claim 1, wherein:
a plurality of antenna structures are transferred all at once from the antenna substrate to selected ones of the transponder sites.

15. The method of claim 1, wherein transferring comprises a contact transfer process.

16. The method of claim 1, wherein:
the antenna substrate is formed of a material which is different from the material of the inlay substrate.

* * * * *